(12) United States Patent
Su et al.

(10) Patent No.: US 12,293,032 B2
(45) Date of Patent: May 6, 2025

(54) ARRAY SUBSTRATE AND PREPARATION METHOD THEREFOR, AND TOUCH-CONTROL DISPLAY APPARATUS

(71) Applicants: Beijing BOE Display Technology Co., Ltd., Beijing (CN); BOE Technology Group Co., Ltd., Beijing (CN)

(72) Inventors: Qiujie Su, Beijing (CN); Xiaofeng Yin, Beijing (CN); Dongchuan Chen, Beijing (CN); Yanping Liao, Beijing (CN); Seungmin Lee, Beijing (CN); Xibin Shao, Beijing (CN)

(73) Assignees: Beijing BOE Display Technology Co., Ltd., Beijing (CN); BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 17/915,498

(22) PCT Filed: Nov. 11, 2021

(86) PCT No.: PCT/CN2021/129974
§ 371 (c)(1),
(2) Date: Sep. 29, 2022

(87) PCT Pub. No.: WO2022/183766
PCT Pub. Date: Sep. 9, 2022

(65) Prior Publication Data
US 2023/0118806 A1   Apr. 20, 2023

(30) Foreign Application Priority Data
Mar. 5, 2021   (CN) .......................... 202110247058.6

(51) Int. Cl.
*G06F 3/041*   (2006.01)
*G06F 3/044*   (2006.01)
(Continued)

(52) U.S. Cl.
CPC ........ *G06F 3/0412* (2013.01); *G06F 3/04164* (2019.05); *H01L 27/124* (2013.01);
(Continued)

(58) Field of Classification Search
CPC .. G06F 3/0412; G06F 3/04164; G06F 3/0445; G06F 2203/04103; G06F 3/0443;
(Continued)

(56) References Cited

U.S. PATENT DOCUMENTS

2010/0194699 A1*  8/2010  Chang ................... G06F 3/0412
                                                                  345/173
2013/0141356 A1   6/2013  Shih et al.
(Continued)

FOREIGN PATENT DOCUMENTS

CN      104536636 A    4/2015
CN      105468202 A    4/2016
(Continued)

OTHER PUBLICATIONS

International Search Report for PCT/CN2021/129974 Mailed Feb. 15, 2022.
(Continued)

*Primary Examiner* — Douglas M Wilson
(74) *Attorney, Agent, or Firm* — Ling Wu; Stephen Yang; Ling and Yang Intellectual Property

(57) ABSTRACT

An array substrate, including: a base substrate, and a plurality of first signal lines, a plurality of second signal lines, a plurality of touch-control signal lines, a first transparent conductive layer and a second transparent conductive layer, which are arranged on the base substrate. The first transparent conductive layer and the second transparent conductive layer are located on the side of the touch-control signal lines that is away from the base substrate. The touch-control signal lines are connected to at least one touch-control
(Continued)

sensing block, which includes a plurality of touch-control electrodes connected to each other and spaced apart from each other; and the first transparent conductive layer or the second transparent conductive layer includes the plurality of touch-control electrodes. The plurality of first signal lines and the plurality of second signal lines intersect to form a plurality of sub-pixel regions, which include opening regions.

15 Claims, 14 Drawing Sheets

(51) Int. Cl.
*G09G 3/20* (2006.01)
*G09G 3/36* (2006.01)
*H01L 27/12* (2006.01)

(52) U.S. Cl.
CPC .......... *H01L 27/1259* (2013.01); *G06F 3/044* (2013.01); *G06F 3/0443* (2019.05); *G06F 3/0445* (2019.05); *G06F 2203/04103* (2013.01); *G06F 2203/04107* (2013.01); *G09G 3/2074* (2013.01); *G09G 3/364* (2013.01); *G09G 2300/0426* (2013.01)

(58) Field of Classification Search
CPC ........... G06F 2203/04107; G06F 3/044; H01L 27/124; H01L 27/1259; G09G 3/2074; G09G 3/364; G09G 2300/0426
See application file for complete search history.

(56) References Cited

U.S. PATENT DOCUMENTS

| | | | |
|---|---|---|---|
| 2016/0224155 A1* | 8/2016 | Kim | G06F 3/0448 |
| 2016/0357310 A1 | 12/2016 | Wang et al. | |
| 2019/0346711 A1 | 11/2019 | Yeh et al. | |
| 2020/0168671 A1 | 5/2020 | Jang et al. | |
| 2021/0011570 A1 | 1/2021 | Luo et al. | |
| 2021/0018781 A1 | 1/2021 | Chen et al. | |
| 2022/0057876 A1* | 2/2022 | Song | G06F 3/0443 |
| 2022/0291798 A1 | 9/2022 | Wang | |

FOREIGN PATENT DOCUMENTS

| | | | |
|---|---|---|---|
| CN | 106908978 A | 6/2017 | |
| CN | 108257980 A | 7/2018 | |
| CN | 109388265 A | 2/2019 | |
| CN | 109582179 A | 4/2019 | |
| CN | 109634467 A | 4/2019 | |
| CN | 110471551 A | 11/2019 | |
| CN | 111490086 A | 8/2020 | |
| CN | 211293912 U | 8/2020 | |
| CN | 212255943 U | 12/2020 | |
| CN | 112860117 A | 5/2021 | |

OTHER PUBLICATIONS

Notice of Allowance dated Oct. 27, 2023 for Chinese Patent Application No. 202110247058.6 and English Translation.

* cited by examiner

ARRAY SUBSTRATE AND PREPARATION METHOD THEREFOR, AND TOUCH-CONTROL DISPLAY APPARATUS

CROSS-REFERENCE TO RELATED APPLICATIONS

The present application is a U.S. National Phase Entry of International Application No. PCT/CN2021/129974 having an international filing date of Nov. 11, 2021, which claims priority to Chinese Patent Application No. 202110247058.6 filed to the CNIPA on Mar. 5, 2021 and entitled "Array Substrate and Preparing Method Thereof, and Touch Display Apparatus". The above-identified applications are hereby incorporated by reference.

TECHNICAL FIELD

The present document relates to, but is not limited to, the field of display technologies, and particularly to an array substrate and a preparing method thereof, and a touch display apparatus.

BACKGROUND

Touch screens can be seen everywhere around us. A touch screen saves a space, is easy to carry, and has a better property of human-computer interaction. Among various kinds of touch screens, capacitive touch screens are widely applied because of their advantages such as relatively strong sensitivity, that multi-touch can be achieved, and the like. An in cell touch structure has been widely concerned in order to reduce a thickness of a panel. The in cell touch structure includes two modes of self-capacitance touch and mutual capacitance touch. An in cell touch screen has relatively high integration and is thinner, so it has a wide application prospect.

SUMMARY

The following is a summary of subject matters described herein in detail. The summary is not intended to limit the protection scope of claims.

Embodiments of the present disclosure provide an array substrate and a preparing method thereof, and a touch display apparatus.

In one aspect, an embodiment of the present disclosure provides an array substrate, including: an underlay substrate, and a plurality of first signal lines, a plurality of second signal lines, a plurality of touch signal lines, a first transparent conductive layer, and a second transparent conductive layer that are disposed on the underlay substrate. The first transparent conductive layer and the second transparent conductive layer are located at a side of the plurality of touch signal lines away from the underlay substrate. A touch signal line is connected with at least one touch sensing block, wherein the touch sensing block includes a plurality of touch electrodes connected with each other and spaced apart, and the first transparent conductive layer or the second transparent conductive layer includes the plurality of touch electrodes. The plurality of first signal lines and the plurality of second signal lines interact to form a plurality of sub-pixel regions, wherein a sub-pixel region includes an opening region; and orthographic projections of the touch signal line and the opening region of at least one sub-pixel region on the underlay substrate are overlapped.

In some exemplary embodiments, the plurality of touch signal lines and the plurality of second signal lines are of a same layer structure, and the plurality of touch signal lines extend along an extending direction of the plurality of second signal lines.

In some exemplary embodiments, the first transparent conductive layer is located at a side of the second transparent conductive layer close to the underlay substrate, within the sub-pixel region, an orthographic projection of the first transparent conductive layer on the underlay substrate covers an orthographic projection of the touch signal line on the underlay substrate.

In some exemplary embodiments, an organic insulating layer is disposed between a film layer in which the touch signal line is located and the first transparent conductive layer.

In some exemplary embodiments, a thickness of the organic insulating layer is about 1 micron to 3 microns.

In some exemplary embodiments, the first transparent conductive layer includes a plurality of touch electrodes, and the second transparent conductive layer includes a plurality of pixel electrodes; or, the first transparent conductive layer includes a plurality of pixel electrodes, and the second transparent conductive layer includes a plurality of touch electrodes.

In some exemplary embodiments, a touch electrode or a pixel electrode located in the second transparent conductive layer has a plurality of slits, wherein an extending direction of a slit intersects with an extending direction of the touch signal line.

In some exemplary embodiments, at least one touch sensing block includes a plurality of touch electrode groups arranged in sequence; and at least one touch electrode group includes a plurality of touch electrodes spaced apart and a first connecting unit which electrically connects the plurality of touch electrodes. The touch sensing block further includes: a second connecting unit which is located between adjacent touch electrode groups and electrically connects the adjacent touch electrode groups.

In some exemplary embodiments, the first connecting unit includes: a first connecting line and a first connecting electrode. The first connecting line and the first signal line are of a same layer structure, the first connecting electrode is located in the second transparent conductive layer, and the first connecting electrode is configured to connect the first connecting line and a touch electrode.

In some exemplary embodiments, the second connecting unit includes: a second connecting electrode; the second connecting electrode is located in the second transparent conductive layer.

In some exemplary embodiments, the second connecting unit further includes: a third connecting electrode; the third connecting electrode and the touch signal line are of a same layer structure, and the second connecting electrode is configured to connect adjacent touch electrode group and the third connecting electrode.

In some exemplary embodiments, the array substrate further includes: a plurality of switching elements located on the underlay substrate, wherein at least one switching element is located between a second signal line and a touch signal line that are adjacent.

In another aspect, an embodiment of the present disclosure further provides a touch display apparatus, including the array substrate as described above.

In some exemplary embodiments, the touch display apparatus further includes: at least one first touch control circuit and at least one second touch control circuit. The array substrate includes: a first touch region and a second touch region located at a side of the first touch region; the first touch control circuit is located at a side of the first touch region away from the second touch region, and the first touch control circuit is connected with a touch sensing block within the first touch region through a touch signal line; the second touch control circuit is located at a side of the second touch region away from the first touch region, and the second touch control circuit is connected with a touch sensing block within the second touch region through a touch signal line.

On the other hand, an embodiment of the present disclosure provides a preparing method for an array substrate, which is used for preparing the array substrate as described above. The preparing method includes: forming a plurality of first signal lines, a plurality of second signal lines, a plurality of touch signal lines, a first transparent conductive layer, and a second transparent conductive layer on the underlay substrate. Herein, the first transparent conductive layer and the second transparent conductive layer are located at a side of the plurality of touch signal lines away from the underlay substrate. A touch signal line is connected with at least one touch sensing block, wherein the touch sensing block includes a plurality of touch electrodes connected with each other and spaced apart, and the first transparent conductive layer or the second transparent conductive layer includes the plurality of touch electrodes. The plurality of first signal lines and the plurality of second signal lines interact to form a plurality of sub-pixel regions, wherein a sub-pixel region includes an opening region; and orthographic projections of a touch signal line and the opening region of at least one sub-pixel region on the underlay substrate are overlapped.

In some exemplary embodiments, forming the plurality of first signal lines, the plurality of second signal lines, the plurality of touch signal lines, the first transparent conductive layer, and the second transparent conductive layer on the underlay substrate includes: forming a first conductive layer on the underlay substrate, wherein the first conductive layer includes the plurality of first signal lines; forming a second conductive layer at a side of the first conductive layer away from the underlay substrate, wherein the second conductive layer includes the plurality of second signal lines and the plurality of touch signal lines; and forming the first transparent conductive layer and the second transparent conductive layer in sequence at a side of the second conductive layer away from the underlay substrate. The first transparent conductive layer includes a plurality of touch electrodes, and the second transparent conductive layer includes a plurality of pixel electrodes, or, the first transparent conductive layer includes a plurality of pixel electrodes, and the second transparent conductive layer includes a plurality of touch electrodes.

Other aspects may be understood upon reading and understanding the drawings and the detailed description.

BRIEF DESCRIPTION OF DRAWINGS

Accompanying drawings are used for providing further understanding of technical solutions of the present disclosure, constitute a part of the specification, and together with the embodiments of the present disclosure, are used for explaining the technical solutions of the present disclosure but not to constitute limitations on the technical solutions of the present disclosure. Shapes and sizes of one or more components in the drawings do not reflect true scales, and are only intended to schematically describe contents of the present disclosure.

DETAILED DESCRIPTION

Figure 1:
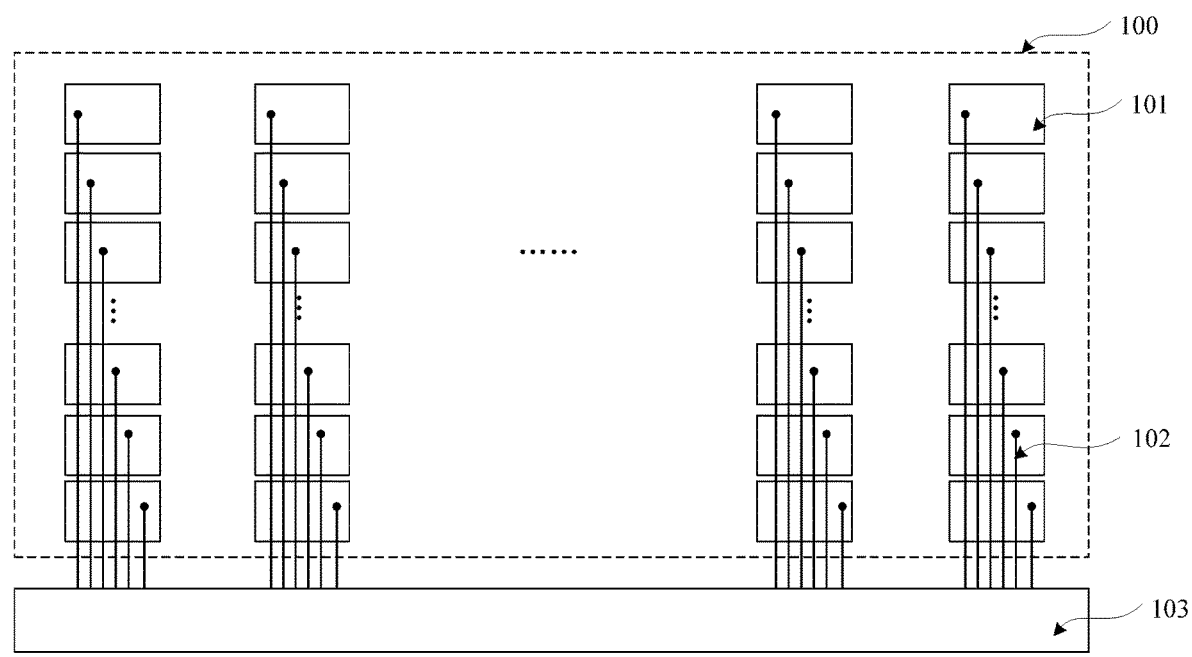
FIG. 1 is a schematic diagram of a touch structure of a touch display apparatus.

The embodiments of the present disclosure will be described below in combination with the drawings in detail. Implementation modes may be implemented in a plurality of different forms. Those of ordinary skills in the art may easily understand such a fact that implementation modes and contents may be transformed into one or more forms without departing from the purpose and scope of the present disclosure. Therefore, the present disclosure should not be explained as being limited to contents described in following implementation modes only. The embodiments in the present disclosure and features in the embodiments may be combined randomly with each other if there is no conflict.

In the drawings, a size of one or more constituent elements, a thickness of a layer, or a region is sometimes exaggerated for clarity. Therefore, one implementation mode of the present disclosure is not necessarily limited to the sizes, and the shapes and sizes of a plurality of components in the accompanying drawings do not reflect actual scales. In addition, the drawings schematically illustrate ideal examples, and one embodiment of the present disclosure is not limited to the shapes, numerical values, or the like shown in the drawings.

Ordinal numerals such as "first", "second" and "third" in the present disclosure are set to avoid confusion of constituents, but not intended for restriction in quantity. "A plurality of" in the present disclosure means a quantity of two or more.

In the present disclosure, sometimes for convenience, wordings "central", "up", "down", "front", "back", "vertical", "horizontal", "top", "bottom", "inside", "outside" and the like indicating orientation or positional relationships are used to illustrate positional relationships between constituent elements with reference to the drawings. These terms are not intended to indicate or imply that involved devices or elements must have specific orientations and be structured and operated in the specific orientations but only to facilitate describing the present specification and simplify the description, and thus should not be understood as limitations on the present disclosure. The positional relationships between the constituent elements may be changed as appropriate based on the directions according to which the constituent elements are described. Therefore, appropriate replacements can be made according to situations without being limited to the wordings described in the specification.

In the present disclosure, unless otherwise specified and defined, terms "mounting", "mutual connection" and "connection" should be understood in a broad sense. For example, a connection may be a fixed connection, or a detachable connection, or an integrated connection. It may be a mechanical connection or an electrical connection. It may be a direct mutual connection, or an indirect connection through middleware, or internal communication between two components. Those of ordinary skills in the art may understand meanings of the above-mentioned terms in the present disclosure according to situations.

In the present disclosure, a transistor refers to an element including at least three terminals, namely, a gate electrode, a drain electrode and a source electrode. The transistor has a channel region between the drain electrode (drain electrode terminal, drain region, or drain) and the source electrode (source electrode terminal, source region, or source), and a current can flow through the drain electrode, the channel region and the source electrode. In the present disclosure, the channel region refers to a region which the current flows mainly through. In the present disclosure, the channel region refers to a region through which the current mainly flows.

In the present disclosure, to distinguish two electrodes of a transistor except a gate electrode, one of the electrodes is referred to as a first electrode and the other electrode is referred to as a second electrode. The first electrode may be a source electrode or a drain electrode, and the second electrode may be a drain electrode or a source electrode. In addition, the gate electrode of the transistor is referred to as a control electrode. In cases that transistors with opposite polarities are used, a current direction changes during operation of a circuit, or the like, functions of the "source electrode" and the "drain electrode" are sometimes interchangeable. Therefore, the "source electrode" and the "drain electrode" are interchangeable in the present disclosure.

In the present disclosure, "electric connection" includes a case where constituent elements are connected through an element with a certain electrical action. The "element having some electrical function" is not particularly limited as long as electrical signals between the connected constituent elements may be transmitted. Examples of the "element with the certain electrical action" not only include electrodes and wirings, but also include switching elements such as transistors, resistors, inductors, capacitors, other elements with one or more functions, etc.

In the present disclosure, "parallel" refers to a state in which an angle formed by two straight lines is above −10 degrees and below 10 degrees, and thus may include a state in which the angle is above −5 degrees and below 5 degrees. In addition, "perpendicular" refers to a state in which an angle formed by two straight lines is above 80 degrees and below 100 degrees, and thus may include a state in which the angle is above 85 degrees and below 95 degrees.

In the present disclosure, "about" and "approximate" refer to a case that a boundary is defined not so strictly and a process and measurement error within a range is allowed.

FIG. 1 is a schematic diagram of a touch structure of a touch display apparatus. The touch display apparatus shown in FIG. 1 may be an in cell touch display apparatus employing a self-capacitive touch technology. As shown in FIG. 1, in an in cell touch display apparatus, a touch structure includes a plurality of touch sensing blocks (as self-capacitive electrodes) 101 arranged in an array, and touch signal lines 102 electrically connected with the touch sensing blocks 101, respectively. Black dots in FIG. 1 represent electrical connections. A touch control circuit 103 is located at one side of a touch region 100 of the touch display apparatus. A touch signal line 102 electrically connects a touch sensing block 101 to the touch control circuit 103. When a touch is performed, when a touch object (for example, a human finger) touches the touch display apparatus, a capacitance of the touch sensing block 101 at a touch point will change, and the touch control circuit 103 determines a touch position by detecting the change of the self-capacitance of the touch sensing block 101.

Because each touch sensing block needs to be connected to the touch signal line, a plurality of touch signal lines are all to be connected to the touch control circuit. When a quantity of the touch signal lines is relatively large, there are problems of difficult routing and heavy load. Moreover, the routing of the touch signal lines will also affect a pixel opening ratio. In some embodiments, when the touch structure shown in FIG. 1 is applied to a large-size touch display apparatus (e.g. a touch display device with 8K resolution), there are a lot of data of the touch sensing blocks and data of the touch signal lines, resulting in a relatively large load on the touch display apparatus, which will affect a performance of the touch display apparatus. Moreover, a relatively large quantity of touch signal lines connecting the touch control circuit will cause fan out wiring to be difficult and affect the pixel opening ratio.

At least one embodiment of the present disclosure provides an array substrate, which includes: an underlay substrate, and a plurality of first signal lines, a plurality of second signal lines, a plurality of touch signal lines, a first transparent conductive layer, and a second transparent conductive layer disposed on the underlay substrate. The first transparent conductive layer and the second transparent conductive layer are located at a side of the plurality of touch signal lines away from the underlay substrate. A touch signal line is connected with at least one touch sensing block, wherein the touch sensing block includes a plurality of touch electrodes connected with each other and spaced apart, and the first transparent conductive layer or the second transparent conductive layer includes the plurality of touch electrodes. The plurality of first signal lines and the plurality of second signal lines intersect to form a plurality of sub-pixel regions. A sub-pixel region includes an opening region. Overlapping of orthographic projections of the touch signal line and the opening region of at least one sub-pixel region on the underlay substrate exists.

In the array substrate according to the present embodiment, the overlapping of the orthographic projections of the touch signal line and the opening region of the sub-pixel region on the underlay substrate is arranged, so that a wiring arrangement of the touch signal line is convenient. Moreover, by disposing the touch signal line at one side of the first transparent conductive layer and the second transparent conductive layer close to the underlay substrate, the pixel opening ratio may be improved.

In some exemplary embodiments, the array substrate of the present embodiment may employ the self-capacitive touch technology. The array substrate includes a pixel electrode and a common electrode, wherein the common electrode is multiplexed into a touch electrode. In a display stage, a common electrode signal is provided to the common electrode through the touch signal line to achieve a display function; and in a touch stage, a touch signal detected by the common electrode is transmitted by the touch signal line to achieve a touch function. In some examples, each touch sensing block may include a plurality of common electrodes multiplexed as touch electrodes, for example, it may include common electrodes with tens by tens of sub-pixels. The touch signal line connected with the touch sensing block may be connected to a driving integrated circuit integrating display and touch functions.

In some exemplary embodiments, the touch display apparatus including the array substrate of the present embodiment may be a liquid crystal display apparatus. The touch display apparatus may include the array substrate of the present embodiment, an opposing substrate, and a liquid crystal layer disposed between the array substrate and the opposing substrate. In some examples, the touch display apparatus may be a display apparatus in an Advanced Super Dimension Switch (ADS) type, or may be a touch display apparatus in a High-Advanced Dimension Switch (HADS) type with a high opening ratio. The pixel electrode and the common electrode included in the array substrate are used for generating an electric field for controlling deflection of liquid crystal molecules in the liquid crystal layer. However, the present embodiment is not limited thereto.

In some exemplary embodiments, the plurality of touch signal lines and the plurality of second signal lines are in a same layer structure, and the plurality of touch signal lines extend along an extending direction of the plurality of second signal lines. In some examples, a second signal line is a data line, and a first signal line is a gate line. However, the present embodiment is not limited thereto. For example, the second signal line is a gate line, and the first signal line is a data line. In the present exemplary embodiment, an arrangement of the touch signal lines may be facilitated by setting the touch signal lines and the second signal lines in the same layer.

In some exemplary embodiments, the first transparent conductive layer is located at one side of the second transparent conductive layer close to the underlay substrate. Within the sub-pixel region, an orthographic projection of the first transparent conductive layer on the underlay substrate covers an orthographic projection of the touch signal line on the underlay substrate. In the present exemplary embodiment, within the sub-pixel region, the touch signal line is shielded by the first transparent conductive layer, so that the pixel opening ratio and a transmittance may be improved.

In some exemplary embodiments, an organic insulating layer is disposed between a film layer in which the touch signal line is located and the first transparent conductive layer. In the present exemplary embodiment, a capacitance between the touch signal line and the first transparent conductive layer may be reduced by disposing the organic insulating layer between the film layer in which the touch signal line is located and the first transparent conductive layer.

In some exemplary embodiments, a thickness of the organic insulating layer is about 1 micron to 3 microns. For example, the thickness of the organic insulating layer may be about 1 micron, or 2 microns. However, the present embodiment is not limited thereto.

In some exemplary embodiments, the first transparent conductive layer includes a plurality of touch electrodes, and the second transparent conductive layer includes a plurality of pixel electrodes; or, the first transparent conductive layer includes a plurality of pixel electrodes, and the second transparent conductive layer includes a plurality of touch electrodes. However, the present embodiment is not limited thereto.

In some exemplary embodiments, a touch electrode or a pixel electrode located in the second transparent conductive layer has a plurality of slits, wherein an extending direction of a slit intersects with an extending direction of the touch signal line.

In some exemplary embodiments, at least one touch sensing block includes: a plurality of touch electrode groups arranged in sequence. At least one touch electrode group includes: a plurality of touch electrodes spaced apart and a first connecting unit which electrically connects the plurality of touch electrodes. The touch sensing block further includes: a second connecting unit which is located between adjacent touch electrode groups and electrically connects the adjacent touch electrode groups. In the present exemplary embodiment, the plurality of touch electrodes are connected to form a touch electrode group, and the plurality of touch electrode groups are connected to form the touch sensing block. For example, one touch electrode group may include touch electrodes corresponding to a plurality of sub-pixels of one pixel unit. However, the present embodiment is not limited thereto.

In some exemplary embodiments, the first connecting unit includes: a first connecting line and a first connecting electrode. The first connecting line and the first signal line are of a same layer structure, the first connecting electrode is located in the second transparent conductive layer, and the first connecting electrode is configured to connect the first connecting line and a touch electrode. In some examples, the first connecting line and the gate line may be of a same layer structure and have a same extending direction. In some examples, the touch electrode is located in the second transparent conductive layer, and the first connecting electrode and the touch electrode may be of an integral structure. In some examples, the touch electrode is located in the first transparent conductive layer, and the first connecting electrode located in the second transparent conductive layer may connect the first connecting line and the touch electrode. However, the present embodiment is not limited thereto.

In some exemplary embodiments, the second connecting unit includes: a second connecting electrode; and the second connecting electrode is located in the second transparent conductive layer. In some examples, the touch electrode is located in the second transparent conductive layer, and a second connecting electrode and the touch electrode may be of an integral structure. However, the present embodiment is not limited thereto.

In some exemplary embodiments, the second connecting unit includes: a second connecting electrode and a third connecting electrode. The second connecting electrode is located in the second transparent conductive layer. The third connecting electrode and the touch signal line are of a same layer structure, and the second connecting electrode is configured to connect adjacent touch electrode groups and the third connecting electrode.

In some exemplary embodiments, the array substrate further includes: a plurality of switching elements located on the underlay substrate, wherein at least one switching element is located between the second signal line and the touch signal line that are adjacent. In some examples, the switching element is a transistor. The switching element may include a control electrode, an active layer, a first electrode, and a second electrode. The control electrode of the switching element may be connected with the gate line, the first electrode is connected with the data line, and the second electrode is connected with the pixel electrode. The switching element is configured to provide a signal of the data line to the pixel electrode under controlling of the gate line.

Solutions of this embodiment will be described below through a plurality of examples. The array substrate according to the present exemplary embodiment included in a touch display apparatus in the ADS type and employing a self-capacitive touch technology is described as an example. For example, the touch display apparatus may include the array substrate according to the present exemplary embodiment, an opposing substrate, and a liquid crystal layer disposed between the array substrate and the opposing substrate. The pixel electrode and the common electrode included in the array substrate may generate an electric field for controlling deflection of liquid crystal molecules in the liquid crystal layer. The opposing substrate may at least include the underlay substrate and a black matrix.

Figure 2A:
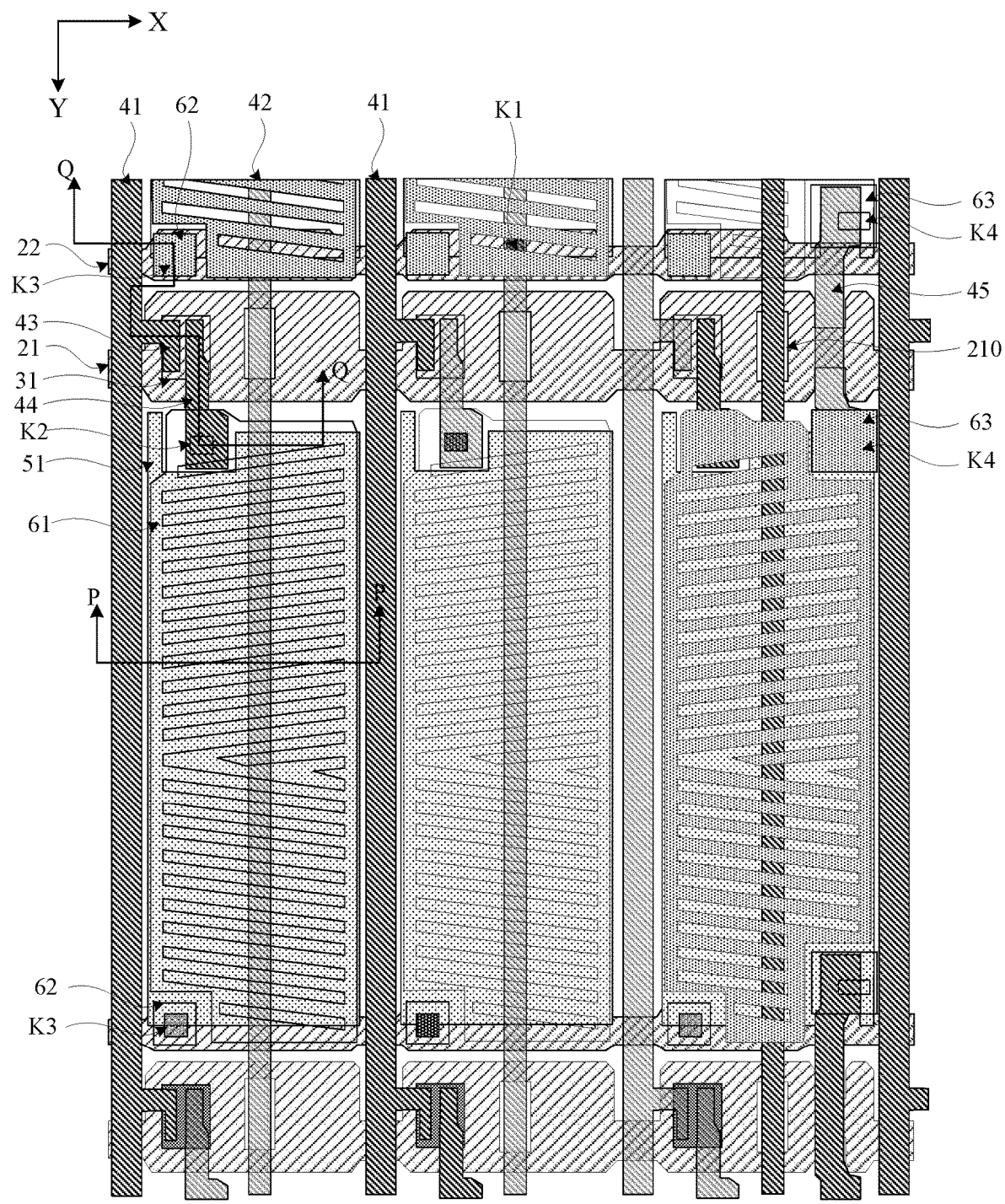
FIG. 2A is a schematic top view of an array substrate according to at least one embodiment of the present disclosure.
Figure 2B:
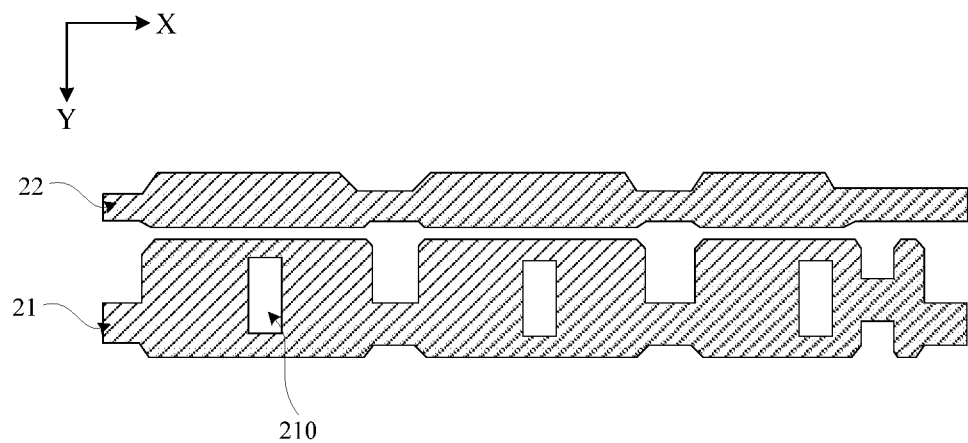
FIG. 2B is a schematic top view of an array substrate after a first conductive layer is formed in FIG. 2A.
Figure 2B:
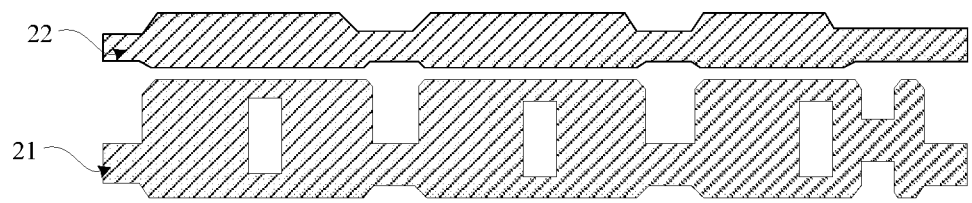
Figure 2C:
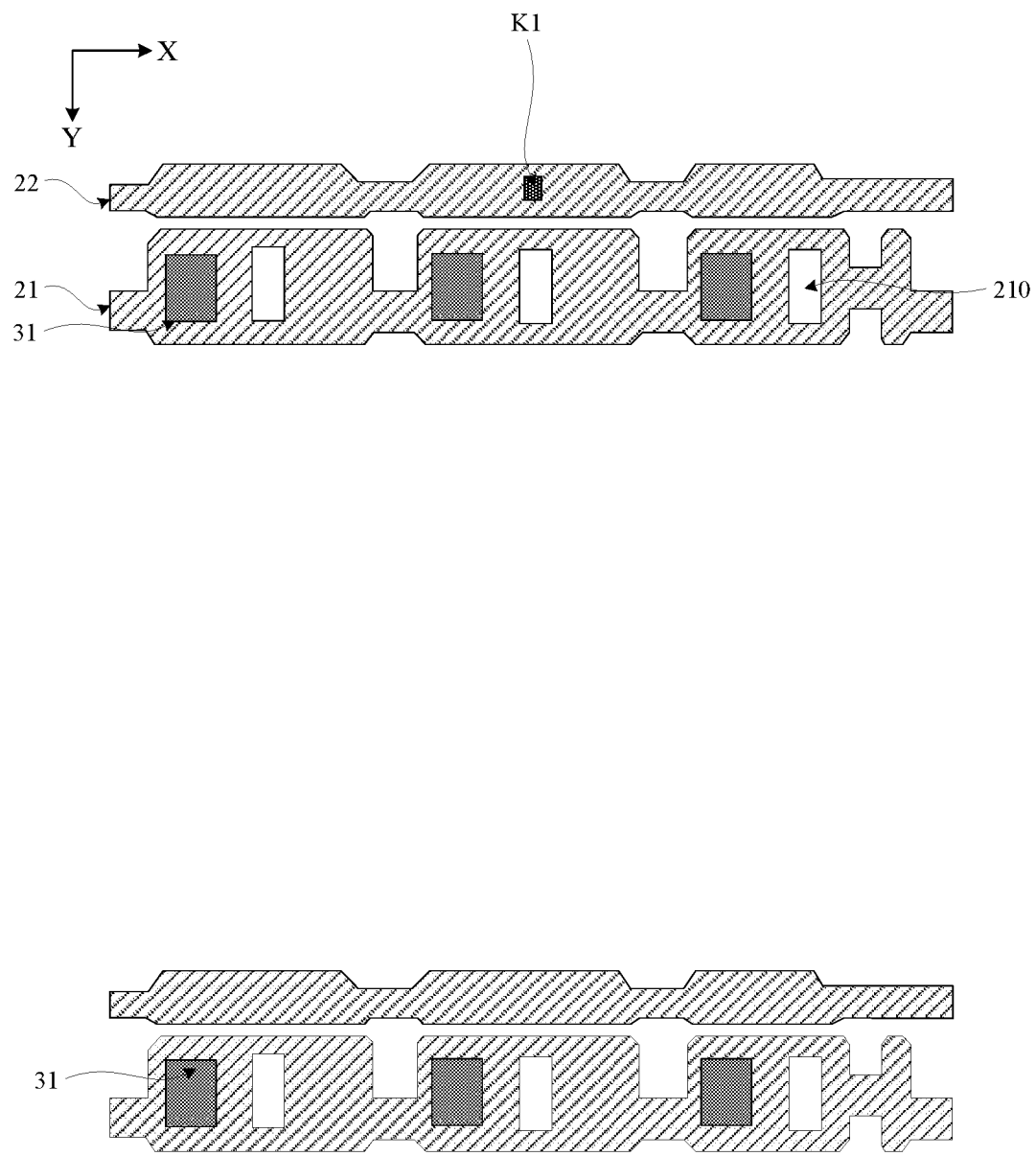
FIG. 2C is a schematic top view of an array substrate after a semiconductor layer is formed in FIG. 2A.
Figure 2D:
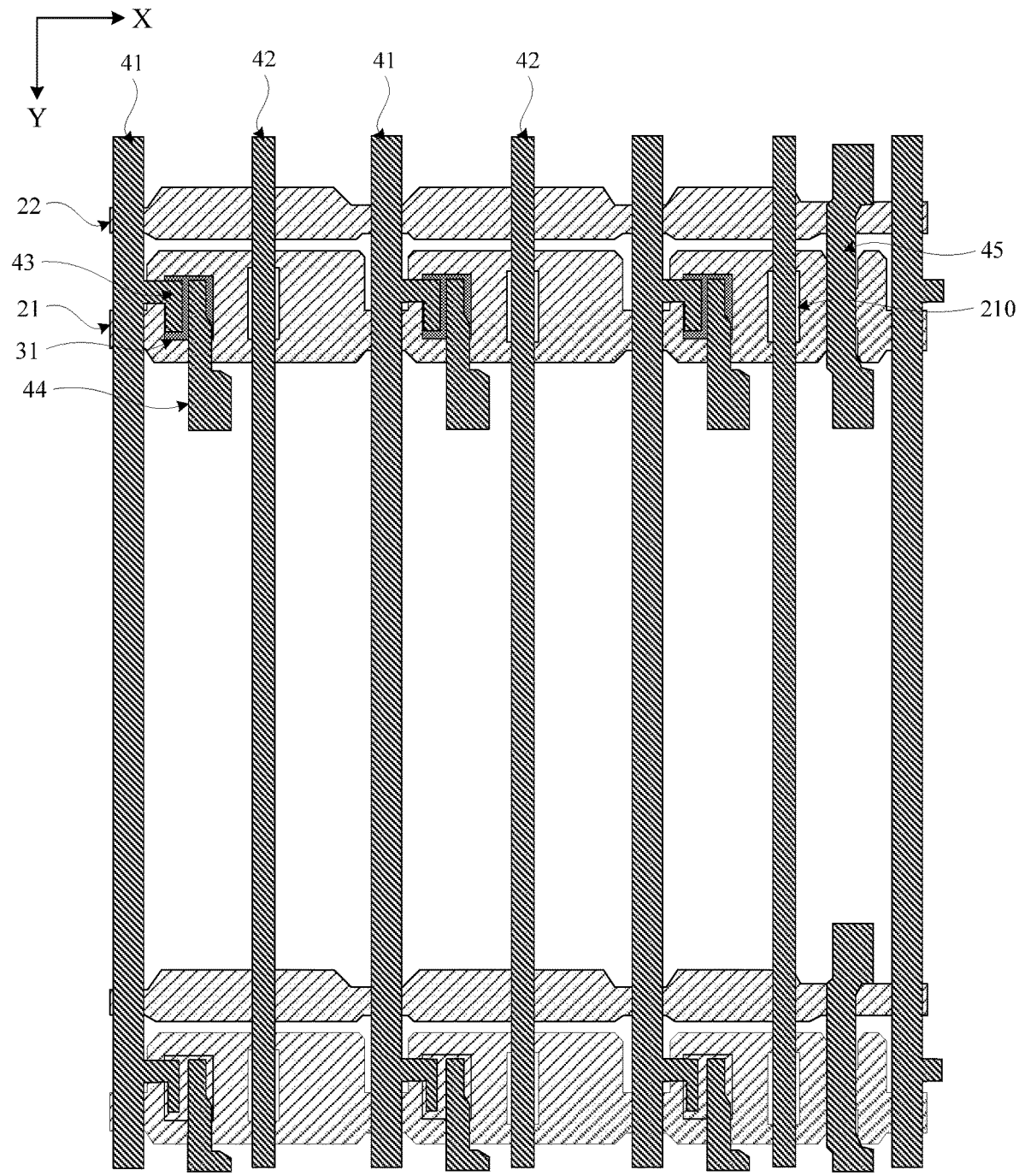
FIG. 2D is a schematic top view of an array substrate after a second conductive layer is formed in FIG. 2A.
Figure 2E:
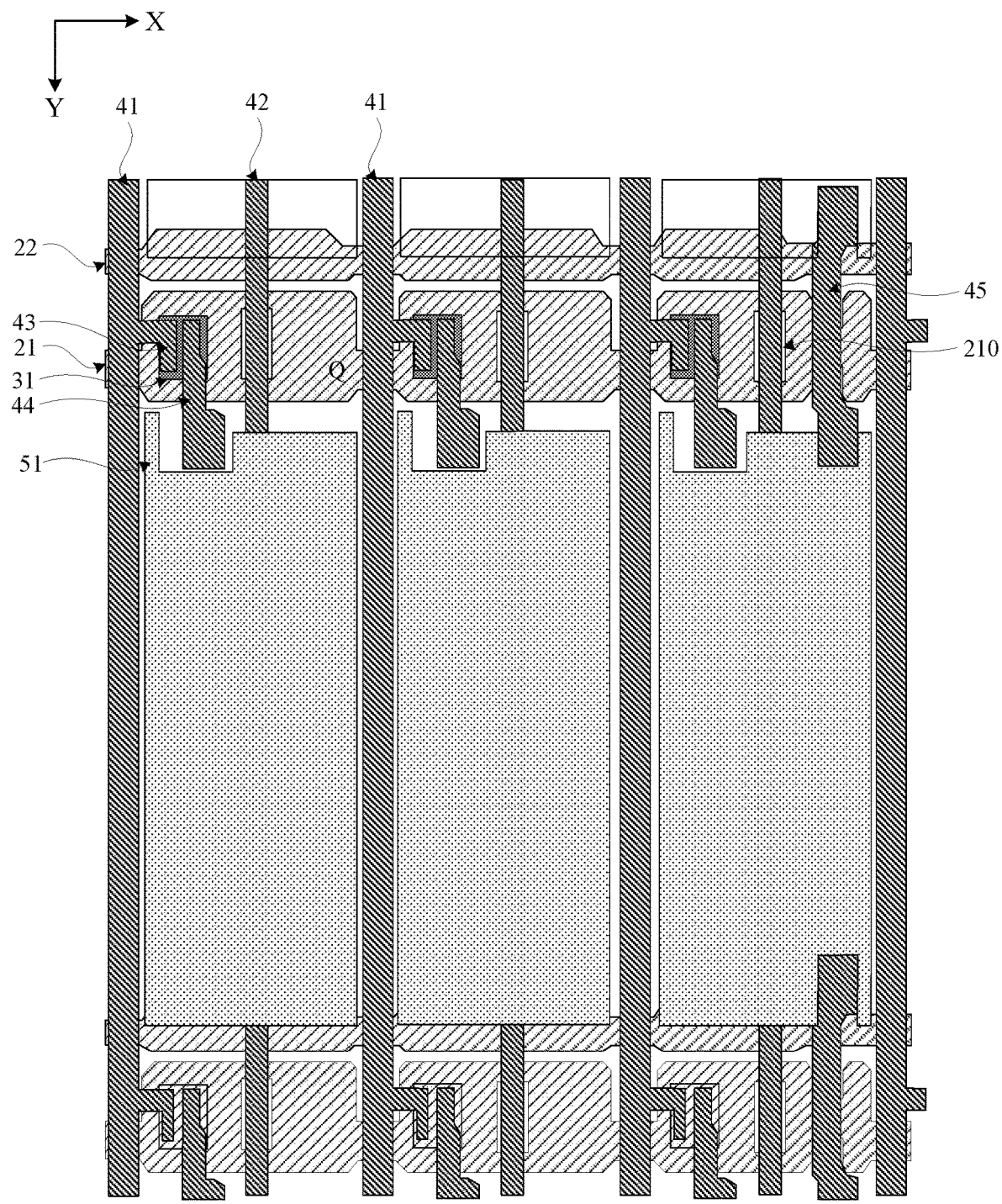
FIG. 2E is a schematic top view of an array substrate after a first transparent conductive layer is formed in FIG. 2A.
Figure 2F:
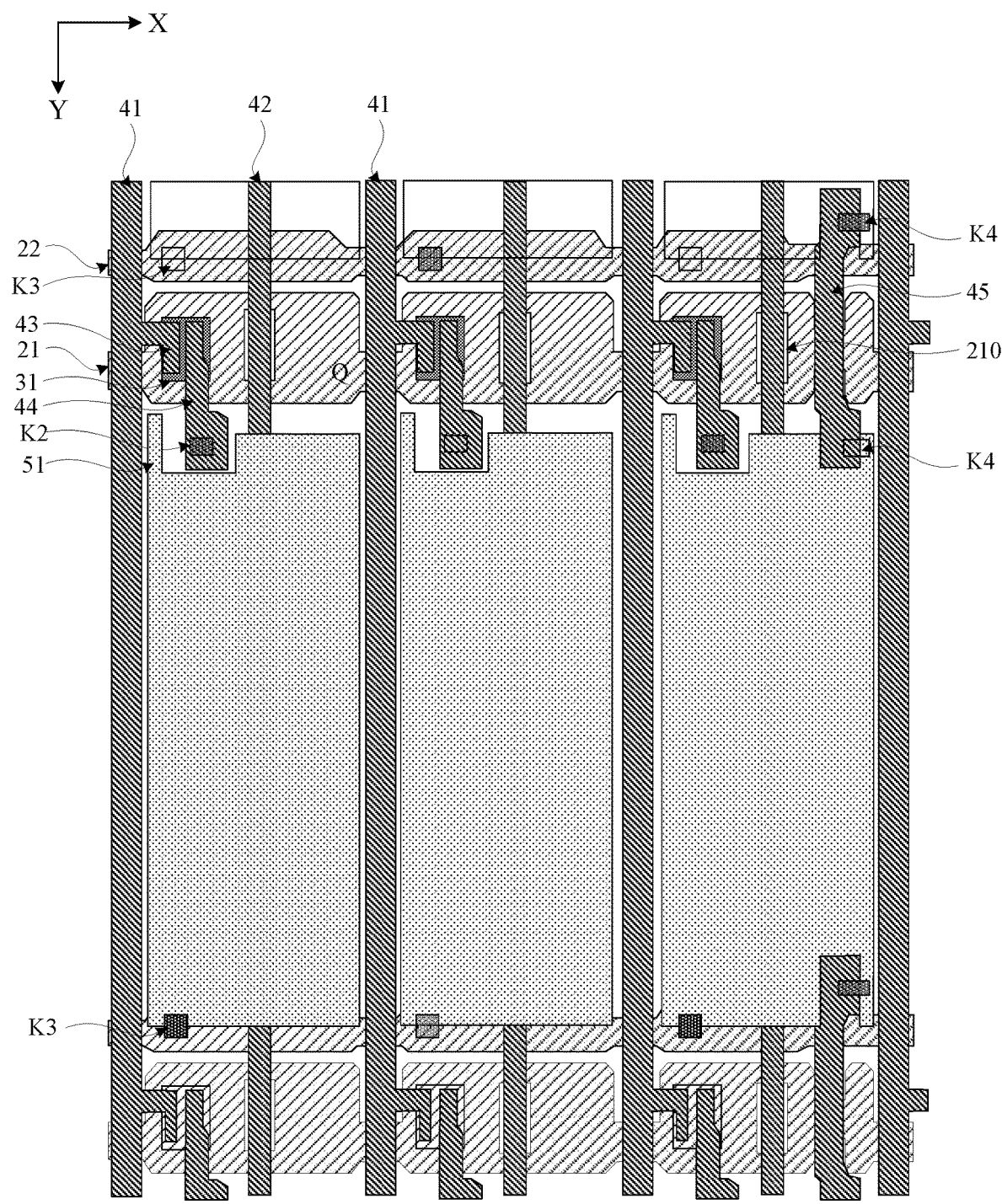
FIG. 2F is a schematic top view of an array substrate after a third insulating layer is formed in FIG. 2A.
Figure 3A:
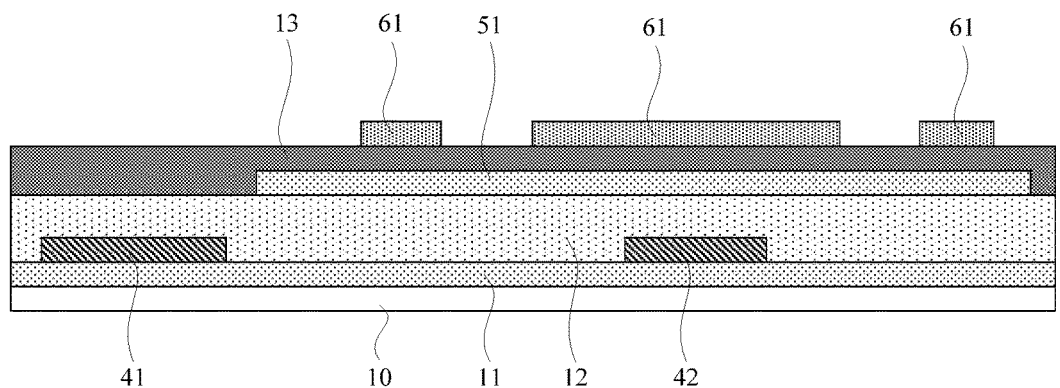
FIG. 3A is a schematic partial sectional view along a P-P direction in FIG. 2A.
Figure 3B:
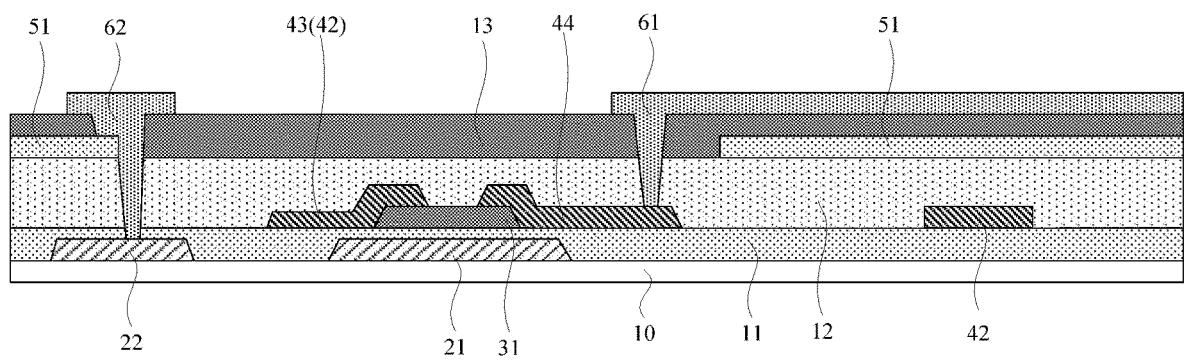
FIG. 3B is a schematic partial sectional view along a Q-Q direction in FIG. 2A.

FIG. 2A is a schematic top view of an array substrate according to at least one embodiment of the present disclosure. FIG. 2B is a schematic top view of an array substrate after a first conductive layer is formed in FIG. 2A. FIG. 2C is a schematic top view of an array substrate after a semiconductor layer is formed in FIG. 2A. FIG. 2D is a schematic top view of an array substrate after a second conductive layer is formed in FIG. 2A. FIG. 2E is a schematic top view of an array substrate after a first transparent conductive layer is formed in FIG. 2A. FIG. 2F is a schematic top view of an array substrate after a third insulating layer is formed in FIG. 2A. FIG. 3A is a schematic partial sectional view along a P-P direction in FIG. 2A. FIG. 3B is a schematic partial sectional view along a Q-Q direction in FIG. 2A. A partial structure of three sub-pixel regions and remaining sub-pixel regions is illustrated in an illustration of this example.

In some exemplary embodiments, as shown in FIGS. 2A to 3B, the array substrate includes: an underlay substrate 10 and a plurality of first signal lines 21 and a plurality of second signal lines 41 disposed on the underlay substrate 10. The plurality of first signal lines 21 are located in the first conductive layer, extend in a first direction X, and are sequentially arranged along a second direction Y different from the first direction X. The plurality of second signal lines 41 are located in the second conductive layer, extend in the second direction Y, and are sequentially arranged along the first direction X. The first direction X intersects with the second direction Y, for example, the first direction X is perpendicular to the second direction Y. The second conductive layer is located at a side of the first conductive layer away from the underlay substrate 10. The plurality of first signal lines 21 and the plurality of second signal lines 41 intersect to form a plurality of sub-pixel regions. A region defined by adjacent first signal lines 21 and adjacent second signal lines 41 intersecting with each other is a sub-pixel region. The sub-pixel region includes an opening region and a non-opening region surrounding the opening region. In some examples, the non-open region is a region that is shielded by the black matrix of the opposing substrate of the array substrate, and the open region is a region that is not shielded by the black matrix. Adjacent first signal lines 21 and second signal lines 41 are all located in the non-opening region. In some examples, the array substrate of the present embodiment is configured to implement a display function, the open region of each sub-pixel region is configured for display, and the non-open region surrounds the open region and does not display. However, the present embodiment is not limited thereto. In some examples, the array substrate may be configured to implement another function.

In some exemplary embodiments, as shown in FIG. 2A to FIG. 3B, an orthographic projection of a second signal line 41 on the underlay substrate 10 intersects with an orthographic projection of a first signal line 21 on the underlay substrate 10. For example, the first signal line 21 has a first width at a position at which it overlaps with the second signal line 41, and the first signal line 21 has a second width at a position between adjacent second signal lines 41. The first width and the second width are both dimensions of the first signal line 21 in the second direction Y. The first width is smaller than the second width. By making the first signal line 21 have a relatively small width at the position at which it overlaps with the second signal line 41, it is beneficial to reduce an overlapping area of the first signal line 21 and the second signal line 41 to reduce a load of the array substrate.

In some exemplary embodiments, the first signal line 21 may be a gate line, and the second signal line 22 may be a data line. However, the present embodiment is not limited thereto. For example, the first signal line may be a data line, and the second signal line may be a gate line.

In some exemplary embodiments, as shown in FIG. 2A, the array substrate further includes a plurality of touch signal lines 42 and a plurality of touch sensing blocks. In some examples, a plurality of touch sensing blocks and a plurality of touch signal lines 42 are connected in one-to-one correspondence. However, the present embodiment is not limited thereto.

In some exemplary embodiments, as shown in FIGS. 2A to 3B, the plurality of touch signal lines 42 extend along an extending direction of the second signal line 41 (i.e., the second direction Y), and are sequentially arranged in an extending direction of the first signal line 21 (i.e., the first direction X). An orthographic projection of one touch signal line 42 on the underlay substrate 10 is located between orthographic projections of two adjacent second signal lines 41 on the underlay substrate 10. The plurality of touch signal lines 42 may be located in the second conductive layer, and in a same layer with the plurality of second signal lines 41. As shown in FIG. 2A, the touch signal line 42 is located in the middle of two second signal lines 41 adjacent to the touch signal line 42. For example, pitches between the touch signal line 42 and adjacent second signal lines 41 at two sides may be substantially the same. By disposing the touch signal line 42 in the middle of the adjacent second signal lines 41 at two sides, a difference between electric fields at two sides of a second signal line 41 may be reduced, which is beneficial to avoid an influence of the touch signal line 42 on a display effect.

In some exemplary embodiments, as shown in FIGS. 2A to 3B, the first signal line 21 has a plurality of hollow portions 210. The plurality of hollow portions 210 are arranged along the first direction X. Overlapping of an orthographic projection of the touch signal line 42 on the underlay substrate 10 and an orthographic projection of a hollow portion 210 of the first signal line 21 on the underlay substrate 10 exists. The hollow portion 210 is an opening penetrating through the first signal line 21. By disposing the hollow portion 210, an overlapping area of the touch signal line 42 and the first signal line 21 may be reduced, thereby reducing the load of the array substrate. In some examples, a length of the hollow portion 210 along the first direction X is greater than a length of the touch signal line 42 along the first direction X. For example, the hollow portion 210 may be a rectangle. However, the present embodiment is not limited thereto.

In some exemplary embodiments, as shown in FIGS. 2A to 3B, overlapping of orthographic projections of the touch signal line 42 and the opening region of the sub-pixel region on the underlay substrate 10 exists. The opening region of the sub-pixel region is provided with a pixel electrode 61 and a touch electrode 51. The touch electrode 51 is multiplexed into a common electrode. In the display stage, the touch electrode 51, serving as the common electrode, is applied with a common electrode signal. A plurality of touch electrodes 51 isolated from each other are connected with each other to form one touch sensing block. For example, touch electrodes 51 isolated from each other within a plurality of sub-pixel regions may be connected with each other to form one touch sensing block.

In some exemplary embodiments, the touch sensing block may include: a plurality of touch electrode groups arranged in sequence, and a second connecting unit which is located between adjacent touch electrode groups and electrically connects the adjacent touch electrode groups. At least one touch electrode group includes: a plurality of touch electrodes 51 spaced apart and a first connecting unit which electrically connects the plurality of touch electrodes 51. In some examples, taking one pixel unit including three sub-pixels as an example, touch electrodes 51 disposed within three sub-pixel regions of one pixel unit may be connected to form one touch electrode group. However, a quantity of touch electrodes included in one touch electrode group is not limited in the present embodiment.

In some exemplary embodiments, as shown in FIGS. 2A to 2D, the first connecting unit includes: a first connecting line 22 and a first connecting electrode 62. The first connecting line 22 is provided in the same layer as the first signal line 21, and the first connecting line 22 extends along the extending direction of the first signal line 21 (i.e. the first direction X). An orthographic projection of the first connecting line 22 on the underlay substrate intersects with the orthographic projection of the second signal line 41 on the underlay substrate 10. For example, the first connecting line 22 has a third width at a position at which it overlaps with the second signal line 41, and the first connecting line 22 has a fourth width at a position between adjacent second signal lines 41. The third width and the fourth width are both dimensions of the first connecting line 22 in the second direction Y. The third width is less than the fourth width. By making the first connecting line 22 have a relatively small width at the position at which it overlaps with the second signal line 41, it is beneficial to reduce an overlapping area of the first connecting line 22 and the second signal line 41 to reduce the load of the array substrate. In some examples, the third width may be less than the first width.

In some exemplary embodiments, as shown in FIGS. 2A and 2D, orthographic projections of the first connecting line 22 and the touch signal line 42 on the underlay substrate 10 overlap. At an overlapping position of the first connecting line 22 and the touch signal line 42, the touch signal line 42 may be connected with the first connecting line 22 through a first via hole K1 to implement a connection between the touch signal line 42 and a corresponding touch sensing block. However, the present embodiment is not limited thereto.

In some exemplary embodiments, as shown in FIG. 2A, the first connecting electrode 62 is located in the second transparent conductive layer. Overlapping of an orthographic projection of the first connecting electrode 62 on the underlay substrate 10 and an orthographic projection of the first connecting line 22 on the underlay substrate 10 exists, and overlapping of the orthographic projection of the first connecting electrode 62 on the underlay substrate 10 and an orthographic projection of the touch electrode 51 on the underlay substrate 10 exists. The first connecting electrode 62 is electrically connected with the touch electrode 51 and the first connecting line 22 through a third via hole K3. In some examples, the first connecting electrode 62 may be a rectangle. However, the present embodiment is not limited thereto. In this example, an electrical connection between the touch electrodes 51 and the first connecting line 22 is implemented through the first connecting electrode 62, and an electrical connection between a plurality of touch electrodes 51 is implemented through the first connecting line 22.

In some exemplary embodiments, as shown in FIGS. 2A to 2D, the second connecting unit includes: a second connecting electrode 63 and a third connecting electrode 45. The third connecting electrode 45 may be located in the second conductive layer, and the third connecting electrode 45 may be located between the touch signal line 42 and adjacent second signal lines 41. An orthographic projection of the third connecting electrode 45 on the underlay substrate 10 may overlap with the orthographic projection of the first signal line 21 on the underlay substrate 10, and may overlap with the orthographic projection of the first connecting line 22 on the underlay substrate 10. The first signal line 21 has a fifth width at a position at which it overlaps with the third connecting electrode 45, wherein the fifth width is smaller than the first width. The fifth width is a dimension of the first connecting line 21 in the second direction Y. For example, the fifth width may be less than or approximately equal to the second width. However, the present embodiment is not limited thereto. The second connecting electrode 63 may be located in the second transparent conductive layer. The second connecting electrode 63 may be connected with the third connecting electrode 45 and the touch electrode 51 through a fourth via hole K4. In this example, the third connecting electrode 45 may extend from one sub-pixel region to another sub-pixel region in the second direction Y, and within a single sub-pixel region, an electrical connection between the third connecting electrode 45 and the touch electrode 51 is implemented through the second connecting electrode 63, thereby implementing an electrical connection of adjacent touch electrode groups. In this example, a touch sensing block is formed in such a manner that a plurality of touch electrodes 51 spaced apart from each other are electrically connected by the first connecting unit and the second connecting unit, so that the touch sensing block has a network-shaped structure, so that the touch sensing block has a relatively small resistance.

In some exemplary embodiments, as shown in FIGS. 2A to 2E, within the opening region of the sub-pixel region, an orthographic projection of the touch electrode 51 located in the first transparent conductive layer on the underlay substrate 10 covers the orthographic projection of the touch signal line 42 on the underlay substrate 10. That is, within the opening region of the sub-pixel region, the touch electrode 51 may shield the touch signal line 42, thereby avoiding formation of a messy electric field between an edge of the touch signal line 42 and the pixel electrode 61 of the second transparent conductive layer, and avoiding causing a dark field and a loss of a pixel opening ratio.

In some exemplary embodiments, as shown in FIG. 2A, the array substrate further includes: a plurality of switching elements. At least one switching element is located between the second signal line 41 and the touch signal line 42 that are adjacent. At least one switching element and the third connecting electrode 45 are located on opposite sides of the touch signal line 42. The switching element may be a Thin Film Transistor (TFT). The switching element may include a control electrode, an active layer 31, a first electrode 43, and a second electrode 44. The control electrode of the switching element and the first signal line 21 may be of an integral structure, i.e. an overlapping region of the first signal line 21 with the active layer 31 may serves as the control electrode. The first electrode 43 of the switching element may be connected with the second signal line 42, for example, it and the second signal line 42 may be of an integral structure. The second electrode 44 of the switching element electrically connects the pixel electrode 61. The active layer 31 may include a channel region, a first doped region, and a second doped region. The channel region may not be doped with an impurity, and has characteristics of a semiconductor. The first doped region and the second doped region may be at both sides of the channel region and doped with impurities, and thus are conductive. The impurities may be changed according to the type of the transistor.

In some exemplary embodiments, as shown in FIG. 3A and FIG. 3B, in a plane perpendicular to the array substrate, the array substrate includes: a first conductive layer, a semiconductor layer, a second conductive layer, a first transparent conductive layer, and a second transparent conductive layer that are sequentially disposed on the underlay substrate 10. Herein, a first insulating layer 11 is disposed between the first conductive layer and the semiconductor layer, a second insulating layer 12 is disposed between the second conductive layer and the first transparent conductive layer, and a third insulating layer 13 is disposed between the first transparent conductive layer and the second transparent conductive layer. In some examples, the first insulating layer 11 and the third insulating layer 13 may be inorganic insulating layers, and the second insulating layer 12 may be an organic insulating layer.

Technical solutions of the present embodiment will be further described below with reference to FIG. 2A to FIG. 3B through a process for preparing the array substrate according to the present exemplary embodiment. The "patterning process" mentioned in the present embodiment includes processes such as film deposition, photoresist coating, mask exposure, developing, etching and photoresist stripping. The deposition may be selected as any one or more of sputtering, evaporation and chemical vapor deposition, the coating may be selected as any one or more of spraying and spin coating, and etching may be selected as any one or more of dry etching and wet etching. A "thin film" refers to a layer of a thin film prepared from a material on a base substrate using a process of deposition or coating. If a patterning process or a photo-etching process is not needed for the "thin film" during the entire manufacturing process, the "thin film" may also be referred to as a "layer". If a patterning process or a photo-etching process is needed for the "thin film" during the entire manufacturing process, it is referred to as a "thin film" before the patterning process and referred to as a "layer" after the patterning process. The "layer" after the patterning process or photo-etching process includes at least one "pattern".

"A and B are disposed in a same layer" mentioned in the present disclosure means that A and B are simultaneously formed through a same patterning process. A "same layer" does not always mean that thicknesses of layers or heights of layers are the same in a sectional view. "An orthographic projection of A contains an orthographic projection of B" means that the orthographic projection of B falls within a range of the orthographic projection of A, or the orthographic projection of A covers the orthographic projection of B.

The process for preparing the array substrate according to the present embodiment includes the following acts (1) to (7).

(1) An underlay substrate is provided.

In some exemplary embodiments, the underlay substrate 10 may be a transparent base substrate, such as a quartz base substrate, a glass base substrate, or an organic resin base substrate. However, the present embodiment is not limited thereto.

(2) A first conductive layer is formed.

In some exemplary embodiments, a first conductive thin film is deposited on the underlay substrate 10, and the first conductive thin film is patterned through a patterning process to form the first conductive layer, as shown in FIG. 2B. The first conductive layer includes: the control electrode of the switching element, the first signal line 21, and the first connecting line 22. The control electrode of the switching element and the first signal line 21 are of an integral structure. The first signal line 21 and the first connecting line 22 each extend along the first direction X, and are sequentially arranged along the second direction Y. In some examples, the first signal line 21 has a plurality of hollow portions 210, wherein the plurality of hollow portions 210 are sequentially arranged along the first direction X. A hollow portion 210 is an opening penetrating through the first signal line 21. An overlapping area of the first signal line 21 and the touch signal line 42 may be reduced by disposing the hollow portion 210 to reduce the load of the array substrate. A width of the first signal line 21 at an overlapping position with the second signal line 41 is smaller than a width at a position between two adjacent second signal lines 41, which may reduce an overlapping area of the first signal line 21 and the second signal line 41, so as to reduce the load of the array substrate. A width of the first connecting line 22 at an overlapping position with the second connecting line 41 is smaller than the width at the position between two adjacent second signal lines 41, which may reduce an overlapping area of the first connecting line 22 and the second signal line 41, so as to reduce the load of the array substrate.

(3) A semiconductor layer is formed.

In some exemplary embodiments, a first insulating thin film and a semiconductor thin film are sequentially deposited on the underlay substrate 10 on which the aforementioned structure is formed, and the semiconductor thin film is patterned through a patterning process to form the first insulating layer 11 and a pattern of the semiconductor layer disposed on the first insulating layer 11, as shown in FIG. 2C. In some examples, a plurality of first via holes K1 are opened on the first insulating layer 11, and the first insulating layer 11 in the plurality of first via holes K1 is etched away to expose a surface of the first connecting line 22.

In some exemplary embodiments, the semiconductor layer includes the active layer 31 of the switching element. The active layer 31 may include: a channel region, a first doped region, and a second doped region. The channel region may not be doped with an impurity, and has characteristics of a semiconductor. The first doped region and the second doped region may be arranged at both sides of the channel region and doped with impurities, and thus are conductive. An impurity may be changed according to a type (e.g., an N type or a P type) of a transistor. In some examples, the semiconductor thin film may be made of one or more materials such as amorphous Indium Gallium Zinc Oxide (a-IGZO), Zinc Oxynitride (ZnON), Indium Zinc Tin Oxide (IZTO), amorphous Silicon (a-Si), polysilicon (p-Si), sexithiophene, and polythiophene. That is, the embodiment of the present disclosure is applicable to transistors manufactured based on an oxide technology, a silicon technology, and an organic matter technology. However, the present embodiment is not limited thereto.

(4) A second conductive layer is formed.

In some exemplary embodiments, a second conductive thin film is deposited on the underlay substrate 10 on which the aforementioned structure is formed, and the second conductive thin film is patterned through a patterning process to form the second conductive layer, as shown in FIG. 2D. The second conductive layer includes: a plurality of data lines 41 and a plurality of touch signal lines 42, the first electrode 43 and the second electrode 44 of the switching element, and the third connecting electrode 45. The plurality of data lines 41 and the plurality of touch signal lines 42 each extend along the second direction Y, and are arranged at intervals along the first direction X. Data lines 41 are arranged on both sides of a touch signal line 42. The switching element is located between a data line 41 and an adjacent touch signal line 42. The third connecting electrode 45 is arranged between a touch signal line 42 and an adjacent data line 41, and the third connecting electrode 45 and the switching element are located on opposite sides of one touch signal line 42. The first electrode 43 of the switching element overlaps and is directly connected with the first doped region of the active layer 31, and the second electrode 44 overlaps and is directly connected with the second doped region of the active layer 31. The first electrode 43 of the switching element and an adjacent data line 43 may be of an integral structure. The switching element is located between a data line 43 and an adjacent touch signal line 42. One end of the third connecting electrode 45 is located within one sub-pixel region formed by an intersection of the first signal line 21 and the second signal line 41, and the other end extends across the first signal line 21 and the first connecting line 22 to be within another sub-pixel region.

(5) A second insulating layer and a first transparent conductive layer are formed.

In some exemplary embodiments, a second insulating thin film is coated on the underlay substrate on which the aforementioned structure is formed, and the second insulating layer 12 is formed through masking, exposing, and developing the second insulating thin film.

Afterwards, a first transparent conductive thin film is deposited on the underlay substrate 10 on which the aforementioned structure is formed, and the first transparent conductive thin film is patterned through a patterning process to form a first transparent conductive layer, as shown in FIG. 2E. The first transparent conductive layer includes: a plurality of touch electrodes 51. A touch electrode 51 is located within the sub-pixel region, and may cover the opening region of the sub-pixel region.

In some exemplary embodiments, the second insulating layer 12 may be made of an organic material such as polyimide, acrylic, or polyethylene terephthalate, etc. In some examples, a thickness of the second insulating layer 12 may be about 1 micron to 3 microns. A dielectric constant of the second insulating layer 12 may be ½ of that of an inorganic material SiNx. However, the present embodiment is not limited thereto. In the present exemplary embodiment, by disposing the second insulating layer made of an organic material, it may be beneficial to reduce a capacitance between the touch signal line 42 and the touch electrode 51 of the first transparent conductive layer.

In the present exemplary embodiment, the common electrode is multiplexed as a touch electrode, a common electrode signal is applied to the common electrode in the display stage to achieve a display function, and a touch signal is applied to the common electrode in the touch stage to achieve a touch function. Therefore, there is no need to additionally manufacture a film layer in which the touch electrode is located, so that a manufacturing process may be saved and a thickness of the array substrate may be reduced.

(6) A third insulating layer is formed.

In some exemplary embodiments, a third insulating thin film is deposited on the underlay substrate 10 on which the aforementioned structure is formed, and the third insulating thin film is patterned to form a pattern of a third insulating layer 13, as shown in FIG. 2F. A plurality of second via holes K2, a plurality of third via holes K3, and a plurality of fourth via holes K4 are formed on the third insulating layer 13. The third insulating layer 13 and the second insulating layer 12 in the plurality of second via holes K2 are etched away to expose a surface of the second electrode 44 of the switching element. At least one third via hole K3 includes a first half hole and a second half hole. The third insulating layer 13, the second insulating layer 12, and the first insulating layer 11 in the first half hole are etched away to expose the surface of the first connecting line 22, and the third insulating layer 13 in the second half hole is etched away to expose a surface of the touch electrode 51. At least one fourth via hole K4 includes: a third half hole and a fourth half hole. The third insulating layer 13 and the second insulating layer 12 in the third half hole are etched away to expose a surface of the third connecting line 45, and the third insulating layer 13 in the fourth half hole is etched away to expose the surface of the touch electrode 51.

(7) A second transparent conductive layer is formed.

In some exemplary embodiments, a second transparent conductive thin film is deposited on the underlay substrate 10 on which the aforementioned structure is formed, and the second transparent conductive thin film is patterned to form the second transparent conductive layer, as shown in FIG. 2A. The second transparent conductive layer includes: a plurality of pixel electrodes 61, a first connecting electrode 62, and a second connecting electrode 63. A pixel electrode 61 is connected with the second electrode 44 of the switching element through a second via hole K2. The first connecting electrode 62 is connected with the first connecting line 22 through the first half hole of the third via hole K3, and is connected with the touch electrode 51 through the second half hole of the third via hole K3. That is, electrical connections between the first connecting electrode 62 and the first connecting line 22 and between the first connecting electrode 62 and the touch electrode 51 are implemented through the third via hole. The second connecting electrode 63 is connected with the third connecting electrode 45 through the third half hole of the fourth via hole K4, and is connected with the touch electrode 51 through the fourth half hole of the fourth via hole K4. That is, electrical connections between the second connecting electrode 63 and the touch electrode 51 and between the second connecting electrode 63 and the third connecting electrode 45 are implemented through the fourth via hole K4. One end of the third connecting electrode 45 is connected with one touch electrode 51 within one touch electrode group through one second connecting electrode 63 within one sub-pixel region, and another end of the third connecting electrode 45 is connected with one touch electrode 51 within an adjacent touch electrode group of the aforementioned touch electrode group through one second connecting electrode 63 within another sub-pixel region. In the present exemplary embodiment, a connection between adjacent touch electrode groups may be implemented through the second connecting electrode 63 and the third connecting electrode 45, and a connection between a plurality of touch electrodes within the touch electrode group may be implemented through the first connecting electrode 62 and the first connecting line 33.

In some exemplary embodiments, the pixel electrode 61 has a plurality of slits. The plurality of slits penetrate through the pixel electrode 61. An extending direction of the plurality of slits intersects with the second direction Y. The pixel electrode 61 has two kinds of slits in different directions, thereby forming a dual domain structure. However, the present embodiment is not limited thereto. For example, the pixel electrode may form a single domain or multi-domain structure.

In an exemplary embodiment, the first insulating layer 11 and the third insulating layer 13 may be made of any one or more of silicon oxide (SiOx), silicon nitride (SiNx), and silicon oxynitride (SiON), and may be a single layer, a multi-layer, or a composite layer. The first conductive thin film and the second conductive thin film may be made of a metal material, such as any one or more of Argentum (Ag), Copper (Cu), Aluminum (Al), Titanium (Ti), and Molybdenum (Mo), or an alloy material of the abovementioned metals, such as an Aluminum-Neodymium alloy (AlNd) or a Molybdenum-Niobium alloy (MoNb), and may be of a single layer structure, or a multi-layer composite structure such as Ti/Al/Ti, etc. The first transparent conductive thin film and the second transparent conductive thin film may be made of a transparent conductive material such as indium tin oxide (ITO) or indium zinc oxide (IZO), etc. However, the present embodiment is not limited thereto.

In the present exemplary embodiment, the touch electrode 51 is located between the underlay substrate 10 and the pixel electrode 61. The touch electrode 51 has a sheet-shaped electrode structure and does not have slits, and each touch electrode 51 has a larger area, which is beneficial to enhance a touch performance. Because the touch electrode 51 is closer to the underlay substrate 10 and has a larger area, a mode of bilateral touch may be achieved. In other words, in a front touch mode, a touch object (e.g. a user's finger) may touch from a side of the underlay substrate 10 at which the touch electrode 51 is disposed; in a back touch mode, the touch object may touch from a side of the underlay substrate 10 at which the touch electrode 51 is not disposed.

The structure of the display substrate of the embodiment of the present disclosure and the manufacturing process thereof are described only as an example. In some exemplary implementation modes, corresponding structures may be altered and patterning processes may be increased or decreased according to actual needs. For example, the touch electrode located in the first transparent conductive layer may be electrically connected directly to the third connecting electrode in the second conductive layer through a via hole provided on the second insulating layer to implement an electrical connection between touch electrode groups. As another example, the first connecting electrode may be respectively connected with the first connecting line and the touch electrode through two independent via holes. However, the present embodiment is not limited thereto.

In the array substrate according to the present exemplary embodiment, by disposing the touch signal line to pass through the opening region of the sub-pixel region, and the opening region of one sub-pixel region only passes through one touch signal line, it is caused that an opening ratio loss region is only a region blocked by the touch signal line, which is beneficial to improve cases of a wiring difficulty and a limited opening ratio because there are a lot of touch signal lines. Moreover, the touch signal line is shielded by the first transparent conductive layer, which may avoid a dark field and an opening ratio loss caused by a messy electric field. In addition, an organic insulating layer is disposed between the first transparent conductive layer and the touch signal line, which may reduce a capacitance between the first transparent conductive layer and the touch signal line.

Figure 4A:
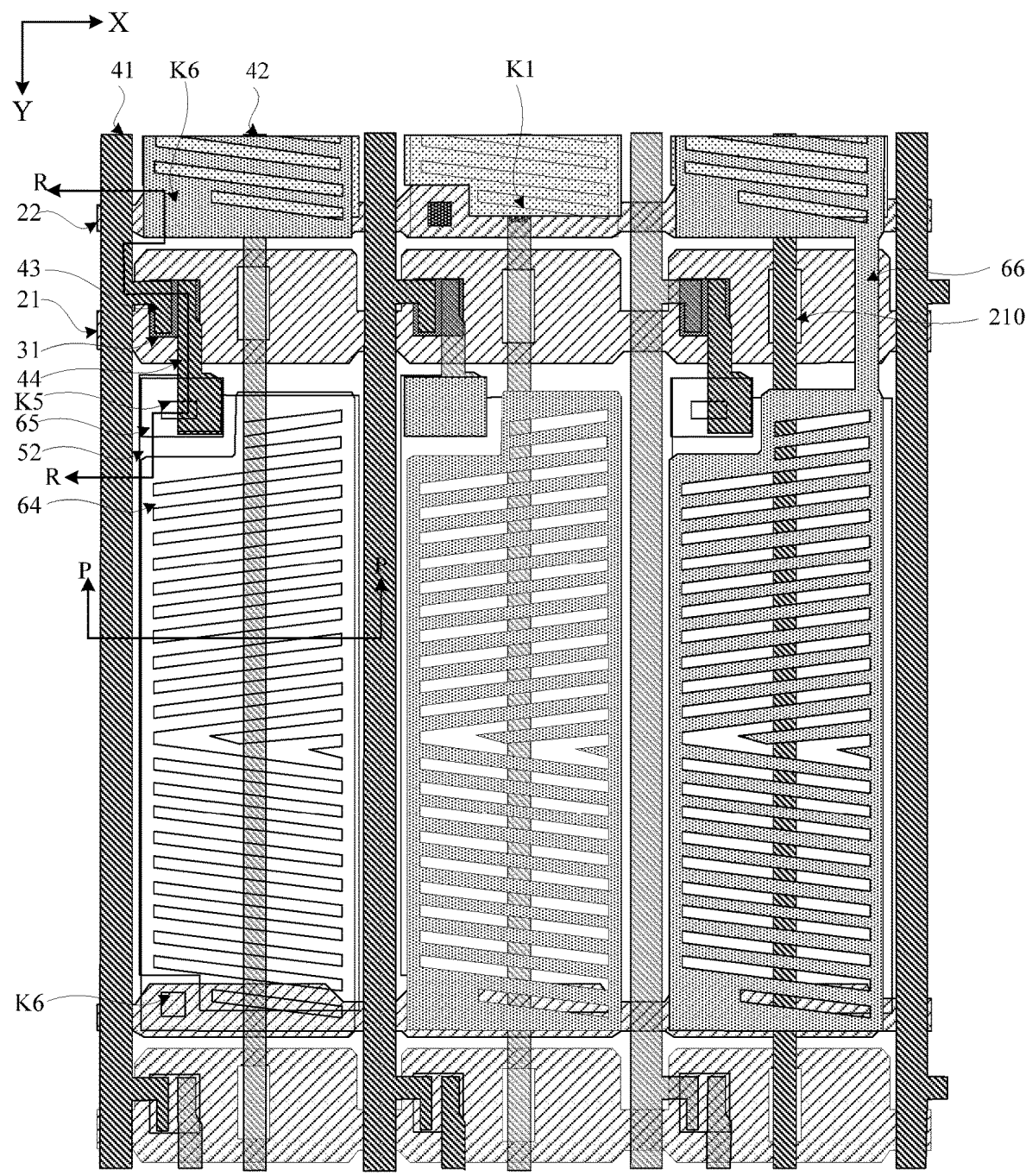
FIG. 4A is another schematic top view of an array substrate according to at least one embodiment of the present disclosure.
Figure 4B:
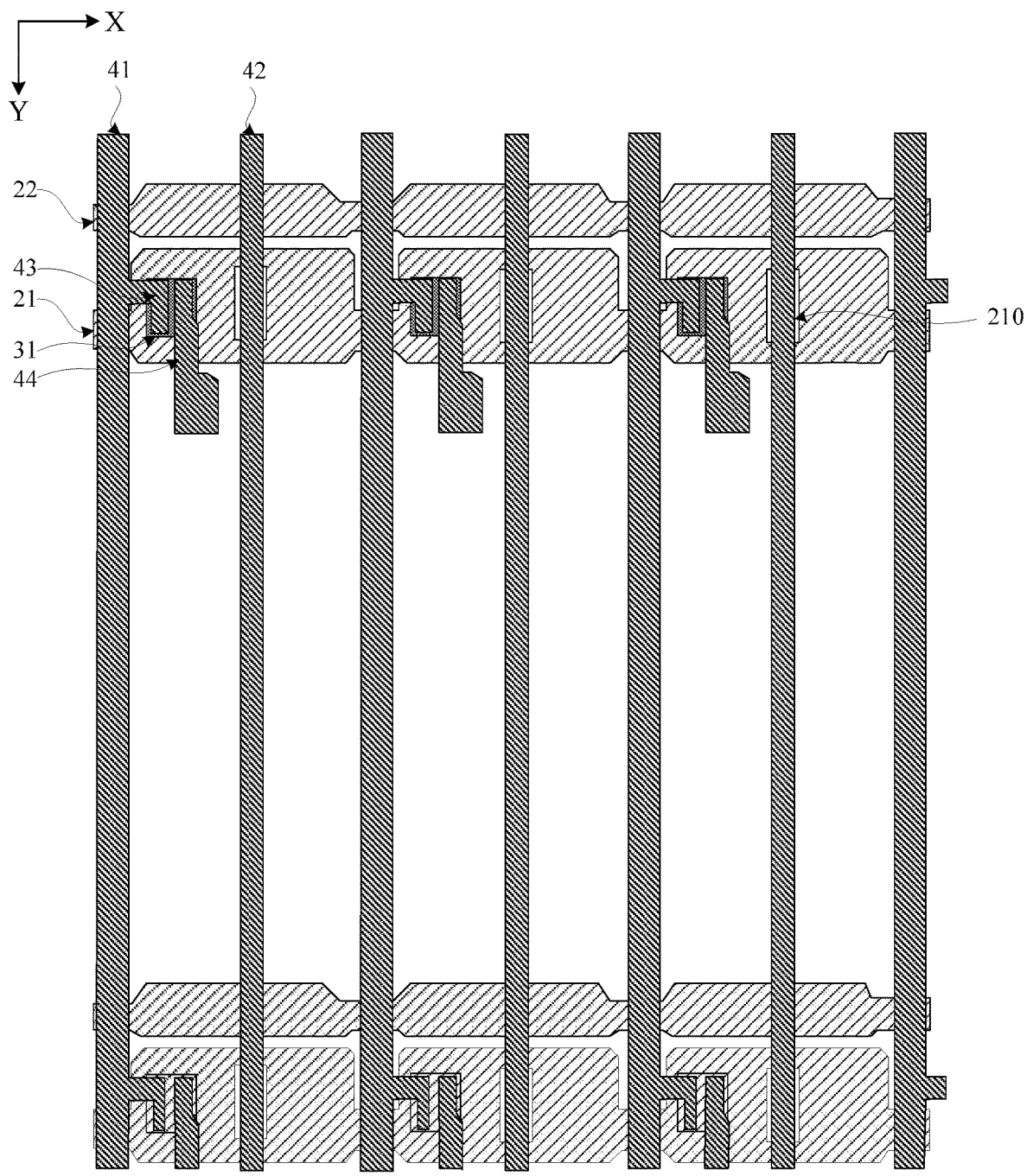
FIG. 4B is a schematic top view of an array substrate after a second conductive layer is formed in FIG. 4A.
Figure 4C:
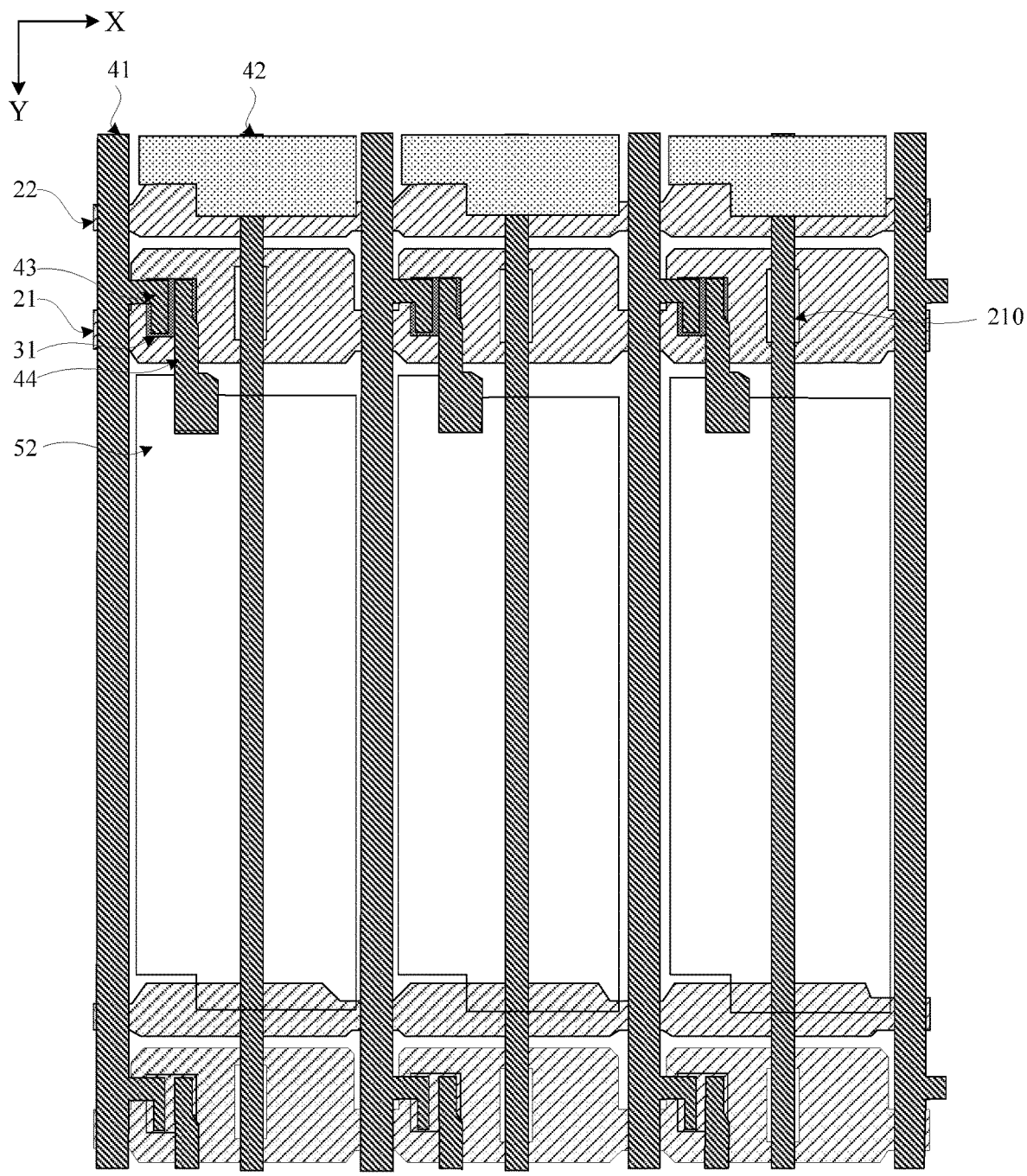
FIG. 4C is a schematic top view of an array substrate after a first transparent conductive layer is formed in FIG. 4A.
Figure 4D:
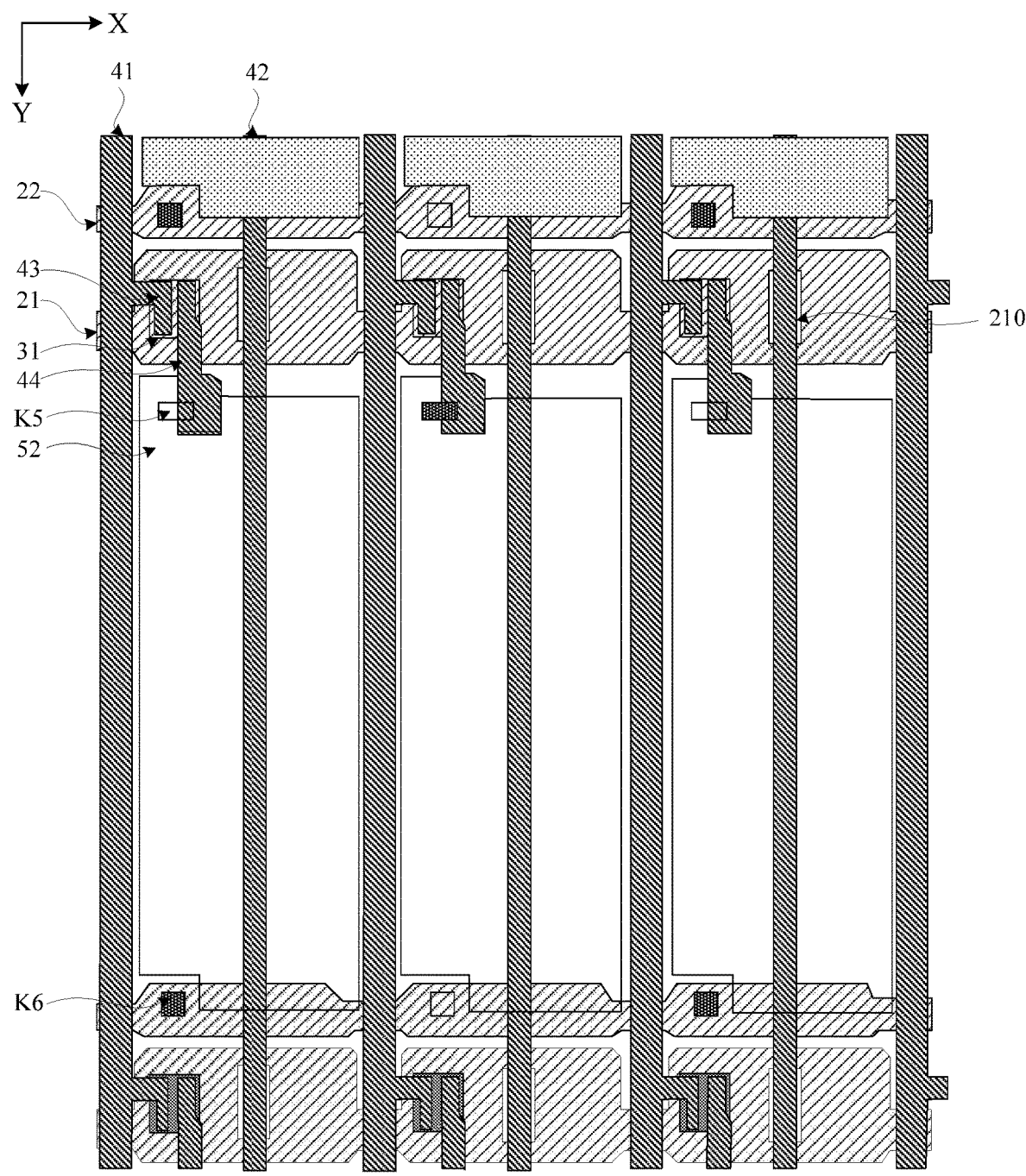
FIG. 4D is a schematic top view of an array substrate after a third insulating layer is formed in FIG. 4A.
Figure 5A:
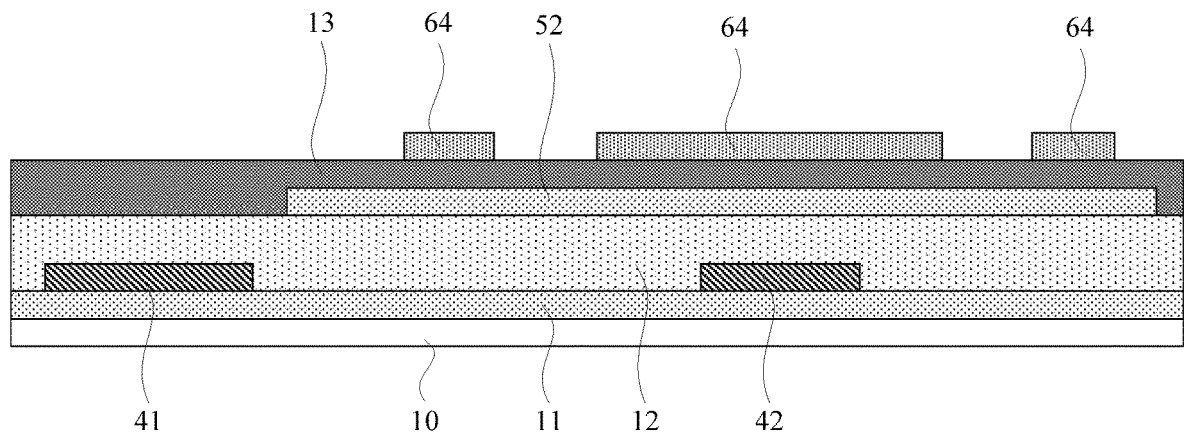
FIG. 5A is a schematic partial sectional view along a P-P direction in FIG. 4A.
Figure 5B:
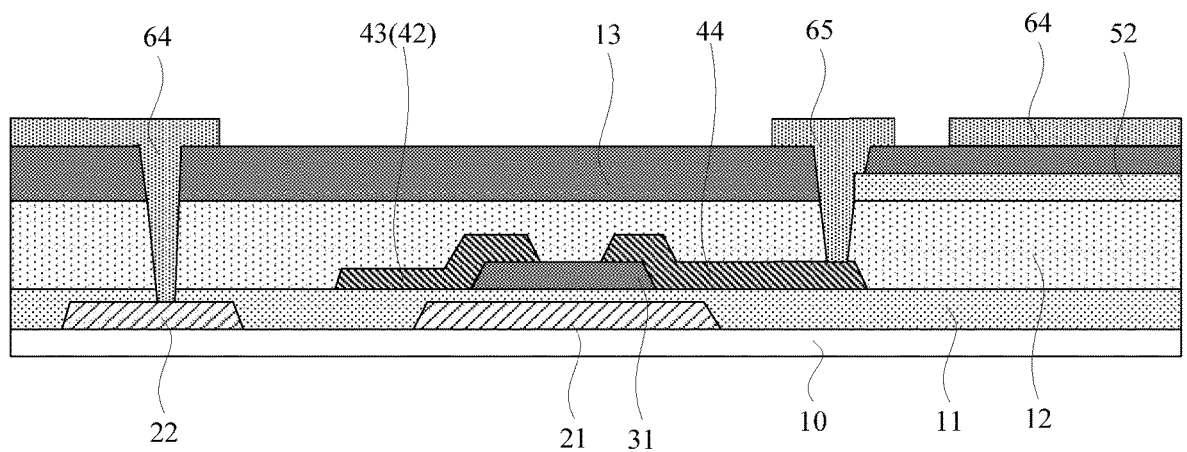
FIG. 5B is a schematic partial sectional view along an R-R direction in FIG. 4A.

FIG. 4A is another schematic top view of an array substrate according to at least one embodiment of the present disclosure. FIG. 4B is a schematic top view of an array substrate after a second conductive layer is formed in FIG. 4A. FIG. 4C is a top view of an array substrate after a first transparent conductive layer is formed in FIG. 4A. FIG. 4D is a top view of an array substrate after a third insulating layer is formed in FIG. 4A. FIG. 5A is a schematic partial sectional view along a P-P direction in FIG. 4A. FIG. 5B is a schematic partial sectional view along an R-R direction in FIG. 4A. A partial structure of three sub-pixel regions and remaining sub-pixel regions is illustrated in an illustration of this example.

In some exemplary embodiments, as shown in FIG. 4A to FIG. 5B, in a plane perpendicular to the array substrate, the array substrate includes: a first conductive layer, a semiconductor layer, a second conductive layer, a first transparent conductive layer, and a second transparent conductive layer that are sequentially disposed on the underlay substrate 10. Herein, a first insulating layer 11 is disposed between the first conductive layer and the semiconductor layer, a second insulating layer 12 is disposed between the second conductive layer and the first transparent conductive layer, and a third insulating layer 13 is disposed between the first transparent conductive layer and the second transparent conductive layer. In some examples, the first insulating layer 11 and the third insulating layer 13 may be inorganic insulating layers, and the second insulating layer 12 may be an organic insulating layer. As shown in FIGS. 4A and 4B, the first conductive layer includes: a plurality of first signal lines 21 and a plurality of first connecting lines 22. The semiconductor layer includes an active layer 31 of the switching element. The second conductive layer includes: a plurality of second signal lines 41, a plurality of touch signal lines 42, a first electrode 43 and a second electrode 44 of the switching element.

In some exemplary embodiments, as shown in FIGS. 4A and 4C, the first transparent conductive layer includes: a plurality of pixel electrodes 52. Within the opening region of the sub-pixel region, an orthographic projection of a pixel electrode 52 on the underlay substrate 10 covers an orthographic projection of a touch signal line 42 on the underlay substrate 10, so as to achieving shielding the touch signal line 42 and avoid the dark field and the opening ratio loss caused by the messy electric field. The second transparent conductive layer includes: a plurality of touch electrodes 64, a fourth connecting electrode 65, and a second connecting electrode 66. In this example, a plurality of fifth via holes K5 and a plurality of sixth via holes K6 are opened on the third insulating layer 13. At least one fifth via hole K5 includes a fifth half hole and a sixth half hole. The third insulating layer 13 and the second insulating layer 12 in the fifth half hole are etched away to expose the second electrode 44 of the switching element. The third insulating layer 13 in the sixth half hole is etched away to expose the pixel electrode 52. The fourth connecting electrode 65 is connected with the second electrode 44 of the switching element through the fifth half hole of the fifth via hole K5, and is connected with the pixel electrode 52 through the sixth half hole of the fifth via hole K5. That is, the fourth connecting electrode 65 implements an electrical connection between the pixel electrode 52 and the second electrode 44 of the switching element through the fifth via hole K5. The third insulating layer 13, the second insulating layer 12, and the first insulating layer 11 in a sixth via hole K6 are etched away to expose a surface of the first connecting line 22. The touch electrode 64 may be electrically connected with the first connecting line 22 through the sixth via hole K6. In other words, in this example, the first connecting electrode and the touch electrode 64 may be of an integral structure. In this example, the second connecting electrode 66 and two adjacent touch electrodes 64 are of an integral structure to implement an electrical connection of adjacent touch electrode groups.

In some exemplary embodiments, the pixel electrode 52 is located between the underlay substrate 10 and the touch electrode 64. The touch electrode 64 has a plurality of slits. An extending direction of the plurality of slits intersects with the second direction Y. The touch electrode 64 has two kinds of slits in different directions, thereby forming a dual domain structure. However, the present embodiment is not limited thereto. For example, the touch electrode may form a single domain or multi-domain structure.

In the array substrate according to the present exemplary embodiment, by disposing the touch signal line to pass through the opening region of the sub-pixel region, and the opening region of one sub-pixel region only passes through one touch signal line, it is caused that an opening ratio loss region is only a region blocked by the touch signal line, which is beneficial to improve the cases of the wiring difficulty and the limited opening ratio because there are a lot of touch signal lines. Moreover, the touch signal line is shielded by the first transparent conductive layer, which may avoid the dark field and the opening ratio loss caused by the messy electric field. In addition, an organic insulating layer is disposed between the first transparent conductive layer and the touch signal line, which may reduce the capacitance between the first transparent conductive layer and the touch signal line.

For other structures of the array substrate according to the present exemplary embodiment, reference may be made to the description of the aforementioned embodiments, which will not be repeated here.

The structure (or the method) shown in the present embodiment may be combined with structures (or methods) shown in other embodiments as appropriate.

At least one embodiment of the present disclosure further provides a method for preparing an array substrate, which is used for preparing the array substrate as described above. The above preparing method includes: a plurality of first signal lines, a plurality of second signal lines, a plurality of touch signal lines, a first transparent conductive layer, and a second transparent conductive layer are formed on an underlay substrate. Herein, the first transparent conductive layer and the second transparent conductive layer are located at a side of the plurality of touch signal lines away from the underlay substrate. A touch signal line is connected with at least one touch sensing block, wherein the touch sensing block includes a plurality of touch electrodes connected with each other and spaced apart. The first transparent conductive layer or the second transparent conductive layer includes the plurality of touch electrodes. The plurality of first signal lines and the plurality of second signal lines intersect to form a plurality of sub-pixel regions, wherein a sub-pixel region includes an opening region. There is an overlapping between orthographic projections of the touch signal line and the opening region of at least one sub-pixel region on the underlay substrate.

In some exemplary embodiments, the plurality of first signal lines, the plurality of second signal lines, the plurality of touch signal lines, the first transparent conductive layer, and the second transparent conductive layer are formed on the underlay substrate, which includes: a first conductive layer is formed on the underlay substrate; a second conductive layer is formed at a side of the first conductive layer away from the underlay substrate; and the first transparent conductive layer and the second transparent conductive layer are sequentially formed at a side of the second conductive layer away from the underlay substrate. The first conductive layer includes the plurality of first signal lines. The second conductive layer includes: the plurality of second signal lines and the plurality of touch signal lines. The first transparent conductive layer includes a plurality of touch electrodes, and the second transparent conductive layer includes a plurality of pixel electrodes; or, the first transparent conductive layer includes a plurality of pixel electrodes and the second transparent conductive layer includes a plurality of touch electrodes.

For descriptions of the preparing method according to the present embodiment in detail, reference may be made to the aforementioned embodiments, which will not be repeated here.

At least one embodiment of the present disclosure further provides a touch display apparatus, which includes the array substrate as described above.

In some exemplary embodiments, the touch display apparatus according to the present embodiment further includes: at least one first touch control circuit and at least one second touch control circuit. The array substrate includes: a first touch region and a second touch region located at a side of the first touch region. The first touch control circuit is located at a side of the first touch region away from the second touch region, and the first touch control circuit is connected with a touch sensing block within the first touch region through a touch signal line; the second touch control circuit is located at a side of the second touch region away from the first touch region, and the second touch control circuit is connected with a touch sensing block within the second touch region through a touch signal line.

Figure 6:
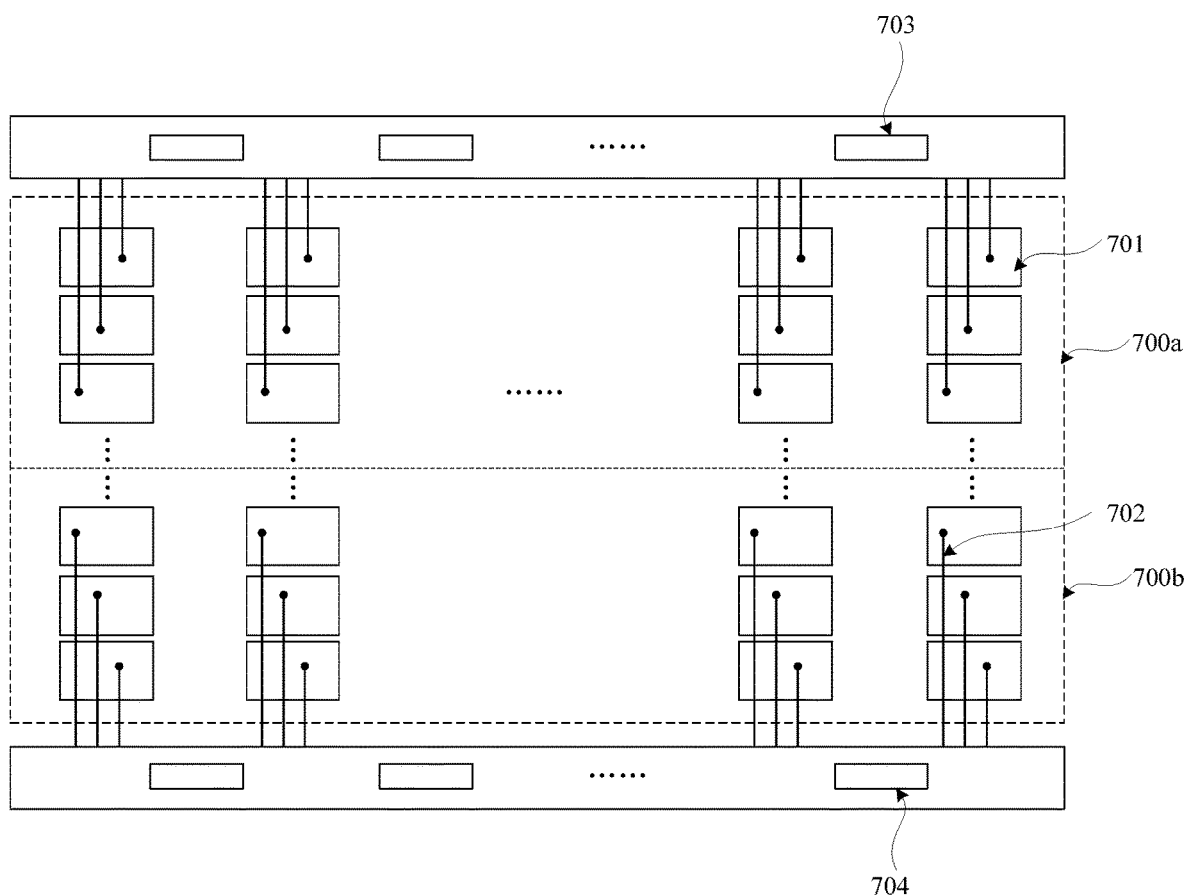
FIG. 6 is a schematic diagram of a touch structure of a touch display apparatus according to at least one embodiment of the present disclosure.

FIG. 6 is a schematic diagram of a touch structure of a touch display apparatus according to at least one embodiment of the present disclosure. As shown in FIG. 6, the touch display apparatus includes: an array substrate, a first touch control circuit 703, and a second touch control circuit 704. The array substrate includes: a first touch region 700a and a second touch region 700b located at a side of the first touch region 700a. For example, the first touch region 700a is an upper half touch region of the touch display apparatus, and the second touch region 700b is a lower half touch region of the touch display apparatus. The first touch control circuit 703 is located at a side of the first touch region 700a away from the second touch region 700b, and the first touch control circuit 703 is connected with a touch sensing block 701 within the first touch region 700a through a touch signal line 702. The second touch control circuit 704 is located at a side of the second touch region 700b away from the first touch region 700a. The second touch control circuit 704 is connected with a touch sensing block 701 within the second touch region 700b through a touch signal line 702. In some examples, the first touch control circuit and the second touch control circuit each may be a Touch and Display Driver Integration (TDDI) circuit.

In some exemplary embodiments, the touch display apparatus may include: an array substrate, an opposing substrate, and a liquid crystal layer disposed between the array substrate and the opposing substrate. A pixel electrode and a common electrode (multiplexed as a touch electrode) included in the array substrate are used for generating an electric field controlling a deflection of liquid crystal molecules in the liquid crystal layer. In some examples, the opposing substrate may include an underlay substrate and a black matrix disposed on the underlay substrate. However, the present embodiment is not limited thereto.

In some exemplary embodiments, the touch display apparatus may be: any product or component with touch and display functions such as a liquid crystal panel, an electronic paper, a mobile phone, a tablet computer, a television, a display, a notebook computer, a digital photo frame, or a navigator, etc.

Compared with a touch structure in a unilateral driving mode shown in FIG. 1, the touch display apparatus according to the present embodiment adopts a bilateral driving mode. A load of the touch signal line includes two portions, i.e., a resistance and a capacitance, and the resistance of the touch signal line is proportional to a length of the touch signal line. In the unilateral driving mode shown in FIG. 1, a maximum length of a distance between the touch signal line and a touch control circuit is, for example, L, and in a case that dimensions of touch display apparatuses are identical, a maximum length of a distance between the touch signal line and the touch control circuit may be L/2 in the bilateral driving mode of the present embodiment, so that the resistance of the touch signal line is reduced by 50%.

In some exemplary embodiments, the touch display apparatus requires M/N touch control circuits, assuming that the touch display apparatus includes M touch sensing blocks and each touch control circuit has N touch signal channels. In the unilateral driving mode shown in FIG. 1, M/N touch control circuits should be uniformly arranged at one side, while in the bilateral driving mode of the present embodiment, M/N touch control circuits may be arranged at two sides of a touch region, for example, only M/2N touch control circuits need to be arranged at each side. In some examples, M/2N first touch control circuits are arranged at one side of the first touch region away from the second touch region, and M/2N second touch control circuits are arranged at one side of the second touch region away from the first touch region. In this way, a difficulty of fanout wiring of the touch signal line may be reduced.

In some exemplary embodiments, taking that a touch display apparatus is an 8K product with 86 inches as an example, each touch sensing block is nearly a square in shape, for example, a side length is about 6.5 mm to 7.0 mm, and the entire touch display apparatus may include about 45,000 touch sensing blocks, that is, 45,000 touch signal lines need to be led out. A resolution of the 8K product is 7680*4320, and there are totally 7680*3=23040 sub-pixels horizontally. In the unilateral driving mode shown in FIG. 1, two touch signal lines should pass through each sub-pixel region; while by adopting the bilateral driving mode according to the present embodiment, only 45000/2=22500 touch signal lines need to be arranged in the first touch region and the second touch region respectively, so that only one touch signal line needs to pass through each sub-pixel region, which may greatly improve the pixel opening ratio.

The touch display apparatus according to the present embodiment may improve the cases of the wiring difficulty and the limited pixel opening ratio because there are a lot of touch signal lines.

The drawings of the present disclosure only involve structures involved in the present disclosure, and other structures may refer to conventional designs. The embodiments of the present disclosure and features in the embodiments may be combined to each other to obtain new embodiments if there is no conflict.

Those of ordinary skills in the art should understand that modifications or equivalent replacements may be made to the technical solutions of the present disclosure without departing from the spirit and the scope of the technical solutions of the present disclosure, and shall all fall within the scope of the claims of the present disclosure.

The invention claimed is:

1. An array substrate, comprising:
   an underlay substrate, and a plurality of first signal lines, a plurality of second signal lines, a plurality of touch signal lines, a first transparent conductive layer, and a second transparent conductive layer disposed on the underlay substrate, wherein:
   the first transparent conductive layer and the second transparent conductive layer are located at a side of the plurality of touch signal lines away from the underlay substrate;
   a touch signal line is connected with at least one touch sensing block, wherein the touch sensing block comprises a plurality of touch electrodes connected with each other and spaced apart, and the first transparent conductive layer or the second transparent conductive layer comprises the plurality of touch electrodes;
   the plurality of first signal lines and the plurality of second signal lines are intersected to form a plurality of sub-pixel regions, wherein each sub-pixel region comprises an opening region; and an orthographic projection of the touch signal line on the underlay substrate and an orthographic projection of the opening region of at least one sub-pixel region on the underlay substrate are overlapped;
   the opening region of each sub-pixel region is located in a display region and configured for display;
   within the opening region of the sub-pixel region, the touch signal lines are shielded by the plurality of touch electrodes;
   distances from the touch signal line to two second signal lines adjacent to the touch signal line are substantially the same;
   at least one touch sensing block comprises a plurality of touch electrode groups arranged in sequence; and at least one touch electrode group comprises a second plurality of touch electrodes spaced apart and a first connecting unit electrically connected to the second plurality of touch electrodes; and the touch sensing block further comprises: a second connecting unit located between adjacent touch electrode groups and electrically connected to the adjacent touch electrode groups.

2. The array substrate of claim 1, wherein the plurality of touch signal lines and the plurality of second signal lines are of a same layer structure, and the plurality of touch signal lines extend along an extending direction of the plurality of second signal lines.

3. The array substrate of claim 1, wherein the first transparent conductive layer is located at a side of the second transparent conductive layer close to the underlay substrate; within the sub-pixel region, an orthographic projection of the first transparent conductive layer on the underlay substrate covers the orthographic projection of the touch signal line on the underlay substrate.

4. The array substrate of claim 3, wherein an organic insulating layer is disposed between a film layer in which the touch signal line is located and the first transparent conductive layer.

5. The array substrate of claim 4, wherein a thickness of the organic insulating layer is about 1 micron to 3 microns.

6. The array substrate of claim 3, wherein the first transparent conductive layer comprises the plurality of touch electrodes, and the second transparent conductive layer comprises a plurality of pixel electrodes, or, the first transparent conductive layer comprises a plurality of pixel electrodes, and the second transparent conductive layer comprises the plurality of touch electrodes.

7. The array substrate of claim 6, wherein at least one touch electrode of the plurality of touch electrodes or at least one pixel electrode of the plurality of pixel electrodes located in the second transparent conductive layer has a plurality of slits, wherein an extending direction of the slits is intersected with an extending direction of the touch signal line.

8. The array substrate of claim 1, wherein the first connecting unit comprises: a first connecting line and a first connecting electrode; the first connecting line and the first signal line are of a same layer structure, the first connecting electrode is located in the second transparent conductive layer, and the first connecting electrode is configured to connect the first connecting line and a touch electrode.

9. The array substrate of claim 1, wherein the second connecting unit comprises: a second connecting electrode; and the second connecting electrode is located in the second transparent conductive layer.

10. The array substrate of claim 9, wherein the second connecting unit further comprises: a third connecting electrode; the third connecting electrode and the touch signal line are of a same layer structure, and the second connecting electrode is configured to connect adjacent touch electrode groups and the third connecting electrode.

11. The array substrate of claim 1, further comprising: a plurality of switching elements located on the underlay substrate, wherein at least one switching element is located between a second signal line and a touch signal line that are adjacent.

12. A touch display apparatus, comprising the array substrate of claim 1.

13. The touch display apparatus of claim 12, further comprising: at least one first touch control circuit and at least one second touch control circuit; the array substrate comprises: a first touch region and a second touch region located at a side of the first touch region; the first touch control circuit is located at a side of the first touch region away from the second touch region, and the first touch control circuit is connected with a touch sensing block within the first touch region through the touch signal line; the second touch control circuit is located at a side of the second touch region away from the first touch region, and the second touch control circuit is connected with a touch sensing block within the second touch region through the touch signal line.

14. A method for preparing an array substrate, used for preparing the array substrate of claim 1, wherein the preparing method comprises:
forming the plurality of first signal lines, the plurality of second signal lines, the plurality of touch signal lines, the first transparent conductive layer, and the second transparent conductive layer on the underlay substrate;
wherein, the first transparent conductive layer and the second transparent conductive layer are located at the side of the plurality of touch signal lines away from the underlay substrate; the touch signal line is connected with at least one touch sensing block, wherein the touch sensing block comprises the plurality of touch electrodes connected with each other and spaced apart, and the first transparent conductive layer or the second transparent conductive layer comprises the plurality of touch electrodes;
the plurality of first signal lines and the plurality of second signal lines are intersected to form the plurality of sub-pixel regions, wherein each sub-pixel region comprises the opening region; and the orthographic projection of the touch signal line on the underlay substrate and the orthographic projection of the opening region of at least one sub-pixel region on the underlay substrate are overlapped.

15. The preparing method of claim 14, wherein forming the plurality of first signal lines, the plurality of second signal lines, the plurality of touch signal lines, the first transparent conductive layer, and the second transparent conductive layer on the underlay substrate comprises:
forming a first conductive layer on the underlay substrate, wherein the first conductive layer comprises the plurality of first signal lines;
forming a second conductive layer at a side of the first conductive layer away from the underlay substrate, wherein the second conductive layer comprises the plurality of second signal lines and the plurality of touch signal lines; and
the first transparent conductive layer and the second transparent conductive layer are sequentially formed at a side of the second conductive layer away from the underlay substrate; the first transparent conductive layer comprises the plurality of touch electrodes, and the second transparent conductive layer comprises a plurality of pixel electrodes, or, the first transparent conductive layer comprises a plurality of pixel electrodes, and the second transparent conductive layer comprises the plurality of touch electrodes.

* * * * *